US010916383B2

(12) United States Patent
Gartia et al.

(10) Patent No.: US 10,916,383 B2
(45) Date of Patent: Feb. 9, 2021

(54) MULTILAYERED GRAPHENE AND METHODS OF MAKING THE SAME

(71) Applicants: Manas Ranjan Gartia, Baton Rouge, LA (US); Ardalan Chaichi, Baton Rouge, LA (US)

(72) Inventors: Manas Ranjan Gartia, Baton Rouge, LA (US); Ardalan Chaichi, Baton Rouge, LA (US)

(73) Assignee: BOARD OF SUPERVISORS OF LOUISIANA STATE UNIVERSITY AND AGRICULTURAL AND MECHANICAL COLLEGE, Baton Rouge, LA (US)

( * ) Notice: Subject to any disclaimer, the term of this patent is extended or adjusted under 35 U.S.C. 154(b) by 0 days.

(21) Appl. No.: 16/122,996

(22) Filed: Sep. 6, 2018

(65) Prior Publication Data

US 2019/0074142 A1  Mar. 7, 2019

Related U.S. Application Data

(60) Provisional application No. 62/554,672, filed on Sep. 6, 2017.

(51) Int. Cl.
| | |
|---|---|
| *H01G 11/36* | (2013.01) |
| *H01G 11/86* | (2013.01) |
| *C30B 29/02* | (2006.01) |
| *C30B 33/02* | (2006.01) |
| *C01B 32/192* | (2017.01) |
| *B05D 3/06* | (2006.01) |

(52) U.S. Cl.
CPC .......... *H01G 11/36* (2013.01); *C01B 32/192* (2017.08); *C30B 29/02* (2013.01); *C30B 33/02* (2013.01); *H01G 11/86* (2013.01); *B05D 3/06* (2013.01); *C01B 2204/30* (2013.01)

(58) Field of Classification Search
CPC ...... H01G 11/36; H01G 11/86; C01B 32/192; C01B 29/02; C01B 33/02; C01B 2204/30; B05D 3/06
See application file for complete search history.

(56) References Cited

U.S. PATENT DOCUMENTS

| 9,099,376 B1* | 8/2015 | Yung | ................... H01L 29/1606 |
| 2011/0183180 A1* | 7/2011 | Yu | .......................... H01G 11/36 |
| | | | 429/128 |
| 2012/0170171 A1* | 7/2012 | Lee | ........................ H01G 11/36 |
| | | | 361/502 |
| 2014/0127488 A1* | 5/2014 | Zhamu | ..................... H01B 1/04 |
| | | | 428/216 |
| 2014/0284718 A1* | 9/2014 | Lim | .................... H01L 21/0237 |
| | | | 257/347 |

(Continued)

OTHER PUBLICATIONS

Chen, et al., National Science Review, 4: 453-489, 2017.

(Continued)

*Primary Examiner* — Dion Ferguson
(74) *Attorney, Agent, or Firm* — Riverside Law LLP

(57) ABSTRACT

The present invention relates in part to a method of fabricating graphene structures from graphene oxide by reducing the graphene oxide on a patterned substrate. The invention also relates in part to graphene structures produced using said method and electrodes and capacitors comprising said graphene structures.

22 Claims, 27 Drawing Sheets

(56) References Cited

U.S. PATENT DOCUMENTS

| | | | | |
|---|---|---|---|---|
| 2015/0111039 A1* | 4/2015 | Kim | ............... | H01B 1/04 |
| | | | | 428/408 |
| 2016/0133395 A1* | 5/2016 | Yoo | ............... | H01G 11/26 |
| | | | | 361/502 |
| 2016/0133396 A1* | 5/2016 | Hsieh | ............... | H01G 11/38 |
| | | | | 361/502 |
| 2017/0081194 A1* | 3/2017 | Zhamu | ............... | C01B 32/23 |
| 2017/0103856 A1* | 4/2017 | Zhamu | ............... | H01G 11/02 |
| 2018/0053604 A1* | 2/2018 | Kim | ............... | C25B 11/0478 |
| 2018/0290891 A1* | 10/2018 | Gong | ............... | H01G 11/56 |
| 2018/0330893 A1* | 11/2018 | Zhamu | ............... | H01G 11/32 |
| 2019/0031513 A1* | 1/2019 | Zhou | ............... | C04B 35/522 |

OTHER PUBLICATIONS

Cote, et al., J. Am. Chem. Soc., 2009, 131, 11027-11032.
El-Kady, et al., Science, 2012, 335, 1326-1330.
Han, et al., Adv. Mater., 2014, 26, 849-864.
Kuila, et al., Nanoscale, 2013, 5, 52-71.
Kyeremateng, et al., Nat. Nanotechnol., 2017, 12, 7-15.
Salunkhe, et al., Chem. Eur. J., 2014, 20, 13838-13852.
Sun, et al., Science 2017, 356, 599-604.
Wang, et al., ACS nano, 2013, 7, 2422-2430.
Wu, et al., Natl Sci Rev., 2014, 1, 277-292.
Xu, et al., Nat. Commun., 2014, 5, 4554.
Yu, et al., Nat. Nanotechnol., 2014, 9, 555-562.

* cited by examiner

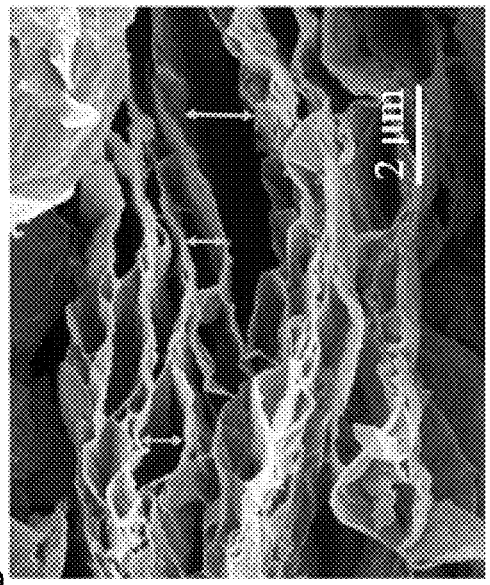
Fig. 5A Laser Reduction
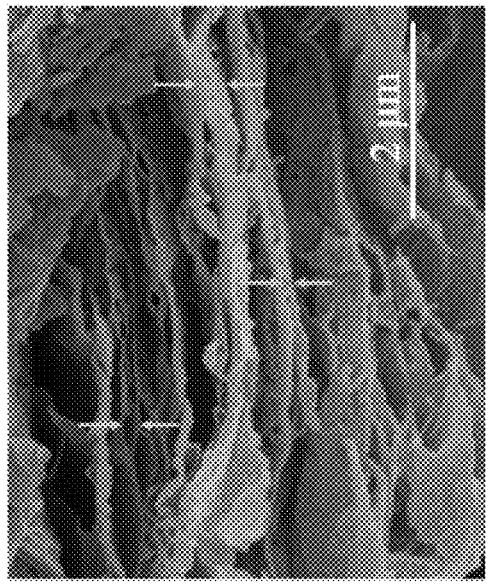
Fig. 5B Flash Reduction
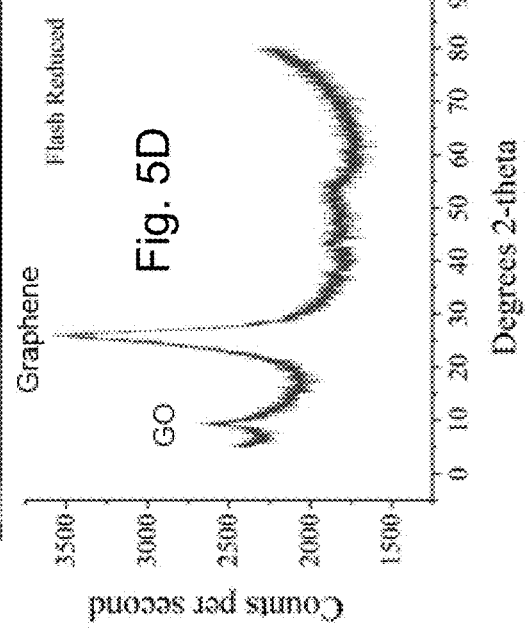
Fig. 5C
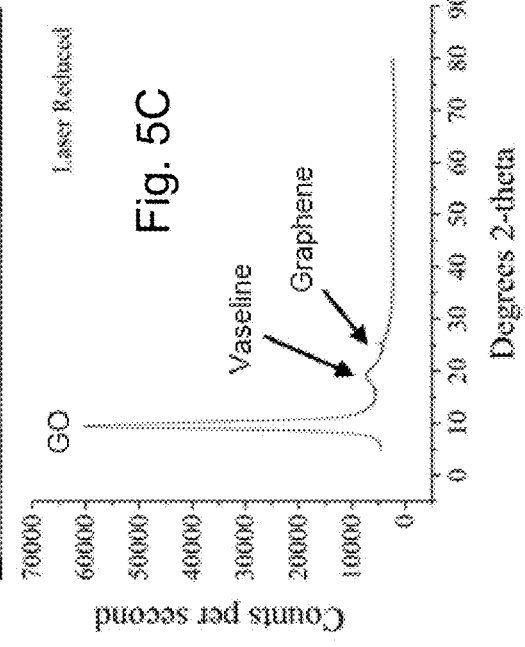
Fig. 5D
Figure 5

MULTILAYERED GRAPHENE AND METHODS OF MAKING THE SAME

CROSS-REFERENCE TO RELATED APPLICATIONS

The present application claims priority to U.S. Provisional Application No. 62/554,672, filed Sep. 6, 2017, which is incorporated by reference herein in its entirety.

BACKGROUND OF THE INVENTION

Supercapacitors and batteries are fundamental technologies for electrochemical energy storage purposes. Although batteries provide considerably high energy densities (100-243 W·h·kg$^{-1}$) (Chee, et al., J. Phys. Chem. C, 2016, 120, 4153-4172; Shao, et al., Chem. Soc. Rev., 2015, 44, 3639-3665), they suffer from extremely low power densities (10-100 W·kg$^{-1}$) (Chee, et al., J. Phys. Chem. C, 2016, 120, 4153-4172; Shao, et al., Chem. Soc. Rev., 2015, 44, 3639-3665; Xiong, et al., Electroanal., 2014, 26, 30-51) that result in several hour recharging times. On the other hand, supercapacitors offer fast recharging times (minutes or even seconds), albeit with lower energy densities compared to batteries. However, coupling batteries with supercapacitors has been accomplished in practical applications, such as electric automobiles, to benefit from the advantages of both products (Wu, et al., Natl Sci Rev., 2014, 1, 277-292; Kim, et al., ACS Nano, 2013, 7, 6899-6905; Lin, et al., Nano Lett., 2012, 13, 72-78; Wang, et al., J. Mater. Chem. A, 2014, 2, 3223-3230; Yan, et al., Carbon, 2019 48, 3825-3833). Therefore, the identification of a material for electrochemical energy storage devices that can handle a high energy density as well as maintaining a high power density would be revolutionary (Gu and Yushin, Wires. Energy Environ., 2014, 3, 424-473). This combination is not achievable unless novel architectures are created at the micro and nano scale to manipulate the common properties of current materials (Wang, et al., J. Mater. Chem. A, 2014, 2, 3223-3230; Li and Shi, Nanoscale, 2012, 4, 5549-5563; Qu, et al., Nano Lett., 2015, 15, 2037-2044; Sun, et al., Science, 2017, 356, 599-604; Xu, et al., J. Phys. Chem. Lett., 2012, 3, 2928-2933). In practical applications, several micro grams of active material per unit area of electrode is required to maintain stable charge/discharge cycles and high reliability.

Nevertheless, nano- and microscale engineered materials cannot be simply scaled up to more than one micro gram per unit area due to the drastic decline of charge storage and charge transfer in electrochemical configurations caused by diffusion constraints (Yoon, et al., ACS Nano, 2014, 8, 4580-4590; Huang, et al., Adv. Mater., 2012, 24, 5979-6004). This limitation can be overcome by providing accessibility for the electrolyte throughout the active material, which is ignored in a vast majority of studies and publications (El-Kady, et al., Science, 2012, 335, 1326-1330; Chen, et al., ACS Nano, 2013, 8, 1039-1046; Li and Shi, J. Phys. Chem. Lett., 2013, 4, 1244-1253). An inability to wet the micro pores within the active material by the electrolyte decreases the likelihood of successful double layer formation in porous materials, which results in a dramatic drop in the double layer capacitance as well as the charge/discharge rate (Gu and Yushin, Wires. Energy Environ., 2014, 3, 424-473; Luo, et al., ACS Nano, 2013, 7, 1464-1471). Consequently, carbon based materials, such as activated carbon, nanotubes and graphene, demonstrate much lower double layer capacitance compared to their theoretical values (Chee, et al., J. Phys. Chem. C, 2016, 120, 4153-4172; Xiong, et al., Electroanal., 2014, 26, 30-51; Gu and Yushin, Wires. Energy Environ., 2014, 3, 424-473). In addition to the unaffordable price of vertically grown carbon nanotubes, the use of carbon nanotubes (CNT) in practical applications requires the addition of conductive polymers necessary for the formation of a pseudocapacitance pair (Basnayaka and Ram, Cond. Polymer Hyb., 2017, 165-192; Cote, et al., J. Am. Chem. Soc., 2009, 131, 11027-11032). Otherwise, the level of capacitance achieved by CNT supercapacitors is considerably low and ineffective (Chee, et al., J. Phys. Chem. C, 2016, 120, 4153-4172; Shao, et al., Chem. Soc. Rev., 2015, 44, 3639-3665; Xiong, et al., Electroanal., 2014, 26, 30-51). Meanwhile, pseudocapacitance is unfavorable in many applications because of the high rate of capacitance decay (Gu and Yushin, Wires. Energy Environ., 2014, 3, 424-473; Kyeremateng, et al., Nat. Nanotechnol., 2017, 12, 7-15). Conversely, a highly porous structure comprising an interconnected graphene network with distinguished electron transfer characteristics is capable of providing an ideal architecture for the manufacture of ultra-high electrical double layer capacitators due to prevailing diffusion limits of ubiquitous carbon-based electrodes (Li and Shi, Nanoscale, 2012, 4, 5549-5563; Qu, et al., Nano lett., 2015, 15, 2037-2044; Lee, et al., ACS Nano, 2013, 7, 9366-9374; Zhang, et al., Sci. Rep., 2013, 3, 1408; Zhu, et al. Nat. Commun., 2012, 3, 1225). The presence of meso and micro porous morphology through an interconnected graphene network increases its capacity for charge storage and maintains the high power density. The electrochemical capacitance for such a structure can even exceed the value for single layer graphene (550 F g$^{-1}$) which has been known as the most ideal type of graphene for energy storage applications (Goh and Pumera, Electrochem. Commun., 2010, 12, 1375-1377). However, interconnected graphene networks demonstrate their most superior properties when the graphene layers are delaminated and stabilized. The easy accessibility of surfaces and edges by electrolytes on the graphene sheets is considered to be the underlying mechanism behind the superiority of this structure over other types of common carbon based materials. However, the extreme restacking propensity of graphene layers restricts their double layer capacitance (Wu, et al., Natl Sci Rev., 2014, 1, 277-292; Lee, et al., ACS Nano, 2013, 7, 9366-9374; Pham, et al., ACS Nano, 2015, 9, 2018-2027). Thus, the advantages of this material for energy storage are underrealized. The accessibility of graphene edge planes plays a significant role in the electrochemical capacitance of other types of graphitic materials, such as in carbon nanotubes. There is a direct relationship between the number of available graphene edge sites and the double layer capacitance for all types of graphitic nanomaterials (Gu and Yushin, Wires. Energy Environ., 2014, 3, 424-473; Xie, et al., ACS Nano, 2015, 9, 5636-5645).

The curved structure of graphene sheets provide a vast wettable surface for electrolytes, but the structure must engineered and manipulated for practical energy storage capacitors. Accordingly, the creation of single layer graphene by various chemical and mechanical methods attracted a lot of interest for energy storage devices (Goh and Pumera, Electrochem. Commun., 2010, 12, 1375-1377). The production of good quality single layer graphene extremely expensive and impractical for mass production (Goh and Pumera, Electrochem. Commun., 2010, 12, 1375-1377; Xie, et al., ACS Nano, 2015, 9, 5636-5645). Therefore, much effort has been put into creating delaminated interconnected graphene morphologies. For example, graphene electrodes that were produced by exfoliation of graphene oxide exhibited a specific capacitance of 100-117 F $g^{-1}$ in 1 M $H_2SO_4$ at the scan rates of 1-0.01 V $s^{-1}$ (Gu and Yushin, Wires. Energy Environ., 2014, 3, 424-473), suggesting that the capacitance of multi layered graphene can be superior to that of carbon nanotubes and onion-like carbon (Chee, et al., J. Phys. Chem. C, 2016, 120, 4153-4172; Gu and Yushin, Wires. Energy Environ., 2014, 3, 424-473). However, these materials are still inferior to carbide-derived carbon, activated carbon, and zeolite templated carbon (Wu, et al., Natl Sci Rev., 2014, 1, 277-292; Gu and Yushin, Wires. Energy Environ., 2014, 3, 424-473). Endeavors to reduce the agglomeration of graphene layers, in order to achieve capacitance closer to the theoretical values, have been started in last few years (Shao, et al., Chem. Soc. Rev., 2015, 44, 3639-3665). The reduction of graphene oxide in hydrazine gaseous media resulted in a specific capacitance of 205 F $g^{-1}$ in a 0.3 KOH electrolyte, though the capacitance decreased dramatically after several cycles (Gu and Yushin, Wires. Energy Environ., 2014, 3, 424-473). Another approach sought to positively charge the graphene surface during the reduction procedure by means of pphenylenediamine (PPD) (Xiong, et al., Electroanal., 2014, 26, 30-51; Gu and Yushin, Wires. Energy Environ., 2014, 3, 424-473). However, these methods did not demonstrate favorable results in energy storage applications (Chee, et al., J. Phys. Chem. C, 2016, 120, 4153-4172; Gu and Yushin, Wires. Energy Environ., 2014, 3, 424-473). The preparation of stabilized graphene in aqueous environments also benefits from aromatic interaction mechanisms and increased the suspension stability of graphene layers and the formation of double layer capacitance (~120 F $g^{-1}$) (Gu and Yushin, Wires. Energy Environ., 2014, 3, 424-473). Decreasing the size of graphene segments also reduces the agglomeration of layers and results in increased electrochemical capacitance, from 82 to 132 F $g^{-1}$, in 1M $H_2SO_4$ electrolyte (Gu and Yushin, Wires. Energy Environ., 2014, 3, 424-473; Xiao, et al., ACS Appl. Mater. Interfaces, 2013, 5, 9656-9662). Curved mesoporous graphene has demonstrated promising specific capacitance in ionic liquids (100-250 F $g^{-1}$), though with poor stability and reliability (Chee, et al., J. Phys. Chem. C, 2016, 120, 4153-4172; Shao, et al., Chem. Soc. Rev., 2015, 44, 3639-3665). The thermal exfoliation of graphene oxide has been reported to produce electrodes with specific capacitance more than 200 F $g^{-1}$, although with very poor stability (Xiao, et al., ACS Appl. Mater. Interfaces, 2013, 5, 9656-9662). Several reports have studied the creation of mesoporous graphene such as holey graphene (Sun, et al., Science 2017, 356, 599-604), GO hydrogels (Zheng, et al., ChemElectroChem 2017, 4, 577-584), nitrogen-doped carbon paper (Zhang, et al., Sci. Rep. 2017, 7, 7769), and three-dimensional (3D) porous graphene (Wen, et al., Carbon 2014, 75, 236-243). Such constructs employ functional groups and demonstrate high pseudocapacitance, which is detrimental for many applications mostly due to low volumetric capacitance (Basnayaka and Ram, Cond. Polymer Hyb., 2017, 165-192; Cote, et al., J. Am. Chem. Soc., 2009, 131, 11027-11032; Wen, et al., Carbon, 2014, 75, 236-243; Yang and Bock, J. Power Sources, 2017, 337, 73-81; El-Kady and Kaner, Nat. Commun., 2013, 4, 1475; Wu, et al., Nat. Commun., 2013, 4:2487; Wu, et al., Adv. Mater., 2015, 27, 4054-4061; Raccichini, et al., Nat. Mater., 2015, 14, 271-279; Yu, et al., Nat. Nanotechnol., 2014, 9, 555-562).

Recently, laser and flash reduction of graphene oxide have been employed to prepare carbon based electrodes for electrochemical energy storage applications (El-Kady, et al., Science, 2012, 335, 1326-1330; Cote, et al., J. Am. Chem. Soc., 2009, 131, 11027-11032; Kyeremateng, et al., Nat. Nanotechnol., 2017, 12, 7-15; Yu, et al., Nat. Nanotechnol., 2014, 9, 555-562; Xu, et al., Nat. Commun., 2014, 5, 4554; Han, et al., Adv. Mater., 2014, 26, 849-864; Kuila, et al., Nanoscale, 2013, 5, 52-71; Wang, et al., ACS nano, 2013, 7, 2422-2430; Salunkhe, et al., Chem. Eur. J., 2014, 20, 13838-13852). However, in these studies, the importance of vital parameters like interlayer spacing and the effect of supporting substrate topography on the capacitance were not explored.

There is a need in the art for stable delaminated graphene structures. This invention satisfies this unmet need.

SUMMARY OF THE INVENTION

In one aspect, the present invention relates to a method of fabricating graphene, including the steps of providing a graphene substrate, depositing graphene oxide on the patterned substrate, and reducing the graphene oxide to graphene. In one embodiment, the method also includes the step of ultrasonicating the graphene oxide prior to deposition. In one embodiment, the step of depositing graphene oxide comprises a technique selected from the group containing spin coating, drop casting, pad printing, doctor blading, casting, screen printing, ink-jet printing, roll coating, and brush coating. In one embodiment, the step of reducing the graphene oxide to graphene comprises treating the graphene oxide with high intensity light. In one embodiment, the high intensity light is generated with a xenon flash.

In one embodiment, the patterned substrate comprises polyethylene terephthalate (PET). In one embodiment, the patterned substrate has structures between 1 µm and 2 µm in width. In one embodiment, the patterned substrate has structures and the distance between the structures is between 0.2 µm and 0.8 µm. In one embodiment, the patterned substrate has structures between 0.5 µm and 1 µm in height.

In another embodiment, the patterned substrate has structures between 10 nm and 100 nm in width. In one embodiment, the patterned substrate has structures and the distance between the structures is between 25 nm and 100 nm. In one embodiment, the patterned substrate has structures between 100 nm and 200 nm in height.

In one aspect, the present invention relates to a graphene structure produced using the methods of the present invention. In one embodiment, the graphene structure includes multiple layers, and the average distance between the layers is greater than 1.6 µm. In one embodiment, the oxygen content of the graphene is less than 25 at. %.

In one aspect, the present invention relates to electrodes that include a graphene structure made using the methods of the instant invention. In one embodiment, the specific capacitance of the electrode is greater than 300 F In one embodiment, the present invention also relates to a capacitor including at least one electrode that includes a graphene structure made using the methods of the instant invention. In one embodiment, the present invention relates to a sandwich-style capacitor that includes at least one electrode containing a graphene structure made using the methods of the instant invention.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

FIGS. 3A-3C, depicts electrical conductivity measurements. FIG. 3A shows the electrical conductivity measurement of GO. FIG. 3B shows the electrical conductivity measurement of LR. FIG. 3C shows the electrical conductivity measurement of FR. The electrical conductivity of GO measured to be $6.38\times10^4$ S/m and after reduction, the conductivity increased to $1.40\times10^3$ S/m and $2.14\times10^3$ S/m for LR and FR process, respectively.

FIG. 5, comprising FIGS. 5A-5D, depicts depicts SEM micrographs along with XRD results. FIG. 5A is a SEM image of the LR sample showing agglomerated compact layers of graphene sheets with the average interlayer spacing of 0.25 µm. FIG. 5B is a SEM image of the FR sample showing the delaminated layers of graphene sheets with the mean spacing of 1.76 µm. FIG. 5C is an XRD of laser reduced graphene. FIG. 5D is an XRD of flash reduced graphene. XRD results show a considerable amount of residual GO (IGO/IGraphene≈11.14) after performing the laser reduction technique. Meanwhile, the value of residual GO remarkably decreased by an order of magnitude (IGO/IGraphene≈0.77) by using the flash reduction method. In order to adhere the LR sample to the sample holder, a thin layer of Vaseline was used.

FIG. 7A is a schematic image of the device. FIG. 7B is a schematic image of the three-electrode configuration used in the electrochemical experiments. FIG. 7C is an image of the device made using FRMS electrodes.

FIGS. 8A-8C, depicts comparisons between graphene oxide, laser reduced GO, and flash reduced GO. FIG. 8A is a series of bright-field images of LR and FR samples apparently showing the color change from brown (in GO) to black (in LR and FR) after laser and flash reduction methods. FIG. 8B is a comparison of the Raman spectra of GO, LR, and FR samples. FIG. 8C is a deconvolution of the D- and G-band for each sample, showing the three constituent peaks.

FIGS. 9A-9C, is a comparison of cross-sectional SEM images of electrodes produced using the flash reduction method on flat and nano- and microstructure substrates showing the effect of substrate engineering. FIG. 9A is a SEM image of the FR sample shows a compact layer of graphene sheets. FIG. 9B is a SEM images of the FRNS electrode illustrate that the thickness of graphene compact layers considerably decreased, but the bottom layers are not still as delaminated as top layers. FIG. 9C is a SEM image of FR GO on the microstructure (FRMS) electrode show the uniformly delaminated layers of graphene from bottom to top.

FIGS. 10A-10C, is a comparison of top-view SEM images of electrodes produced using the flash reduction method on flat and nano- and microstructure substrates showing the effect of substrate engineering. FIG. 10A is a SEM image of GO on the microstructured substrate before the reduction process. The inset shows the geometry of the inverse pyramid structure of the substrate with a pitch of 2 µm, a pit length of 1.5 µm, and a pit depth of 2.1 µm. FIG. 10B is a SEM image of GO on the nanosubstrate before the reduction process. The inset shows the geometry of the periodic nanohole structure of the substrate with a pitch of 350 nm, a hole diameter of 180 nm, and a hole depth of 0.5 µm. FIG. 10C is an AFM analysis confirming the formation of a nanostructured pattern on GO before reduction on the nanostructured substrate.

FIGS. 12A and 12B, depicts X-ray energy dispersive spectra results. FIG. 12A is the X-ray energy dispersive spectrum for graphene flash reduced on a micro substrate (FRMS). FIG. 12B is the X-ray energy dispersive spectrum for graphene flash reduced on a nano substrate (FRNS). The least amount of residual oxygen is observed for FRMS samples due to the sufficient room provided for the escape of oxygen produced during the reduction process of GO to graphene.

FIGS. 13A and 13B, depicts X-ray energy dispersive spectra results. FIG. 13A is the X-ray energy dispersive spectrum for graphene flash reduced on a flat substrate (FR). FIG. 13B is the X-ray energy dispersive spectrum for laser reduced graphene (LR). The residual amount of oxygen increases for FRNS, FR and LR samples, respectively. Therefore, the production method and substrate engineering drastically affect the quality of electrodes.

FIGS. 15A-15D, depicts the XPS spectra of C is in LR, FR, FRNS, and FRMS electrodes. FIG. 15A depicts the XPS results for the LR electrode. FIG. 15B depicts the XPS results for the FR electrode. FIG. 15C depicts the XPS results for the FRNS electrode. FIG. 15D depicts the XPS results for the FRMS electrode. The XPS results confirm the enhanced conversion of GO to graphene while using the flash reduction method on patterned substrates. Deconvolution of the XPS peak into four peaks showed the different oxygen containing functional groups.

FIGS. 20A-20C, depicts the electrochemical performance of LR, FR, FRNS, and FRMS electrodes. FIG. 20A depicts GC/discharge curves at the current density of 100 mA cm$^{-3}$, showing a dramatic difference in the discharge time of various electrodes. The FRMS electrode illustrates the highest double-layer capacitance. FIG. 20B is a Nyquist plot showing the complex plane plot of impedance for four different electrodes. Because of the lowest equivalent series resistance, the FRMS electrode is the most appropriate choice for on-chip applications. FIG. 20C is a plot showing the volumetric capacitance evolution as a function of the current density confirms the functionality of the FRMS electrode at high current densities.

FIGS. 21A-21D, depicts cyclic voltammetry tests in three electrode cells for exemplary electrodes at three scan rates of 0.01, 0.02 and 0.05 V s$^{-1}$. FIG. 21A depicts cyclic voltammograms for laser reduced graphene. FIG. 21B depicts cyclic voltammograms for graphene flash reduced on a flat substrate. FIG. 21C depicts cyclic voltammograms for graphene flash reduced on a nano substrate. FIG. 21D depicts cyclic voltammograms for graphene flash reduced on a micro substrate. The integrated area of each cycle is correlated with the value of capacitance and increases from LR to FRMS electrode by orders of magnitude.

FIGS. 24A-24C, depicts the electrochemical performance of LR, FR, FRNS, and FRMS electrodes. FIG. 24A depicts the evolution of specific capacitance vs scan rate showing the highest diffusion rate in the FRMS sample compared to FRNS, FR, and LR electrodes. FIG. 24B is a reliability plot of different electrodes showing the stability of substrate engineered electrodes for 5000 cycles. FIG. 24C is a Ragone plot confirming that the FRMS electrode demonstrates the highest energy and power densities compared to FRNS, FR, and LR samples.

DETAILED DESCRIPTION

It is to be understood that the Figures and descriptions of the present invention have been simplified to illustrate elements that are relevant for a clear understanding of the present invention, while eliminating, for the purpose of clarity, many other elements found in supercapacitors and graphene electrodes. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

As used herein, each of the following terms has the meaning associated with it in this section. Unless defined otherwise, all technical and scientific terms used herein generally have the same meaning as commonly understood by one of ordinary skill in the art to which this invention belongs.

The articles "a" and "an" are used herein to refer to one or to more than one (i.e. to at least one) of the grammatical object of the article. By way of example, "an element" means one element or more than one element.

As used herein, the term "about" will be understood by persons of ordinary skill in the art and will vary to some extent depending on the context in which it is used. As used herein when referring to a measurable value such as an amount, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

DESCRIPTION

Figure 1:
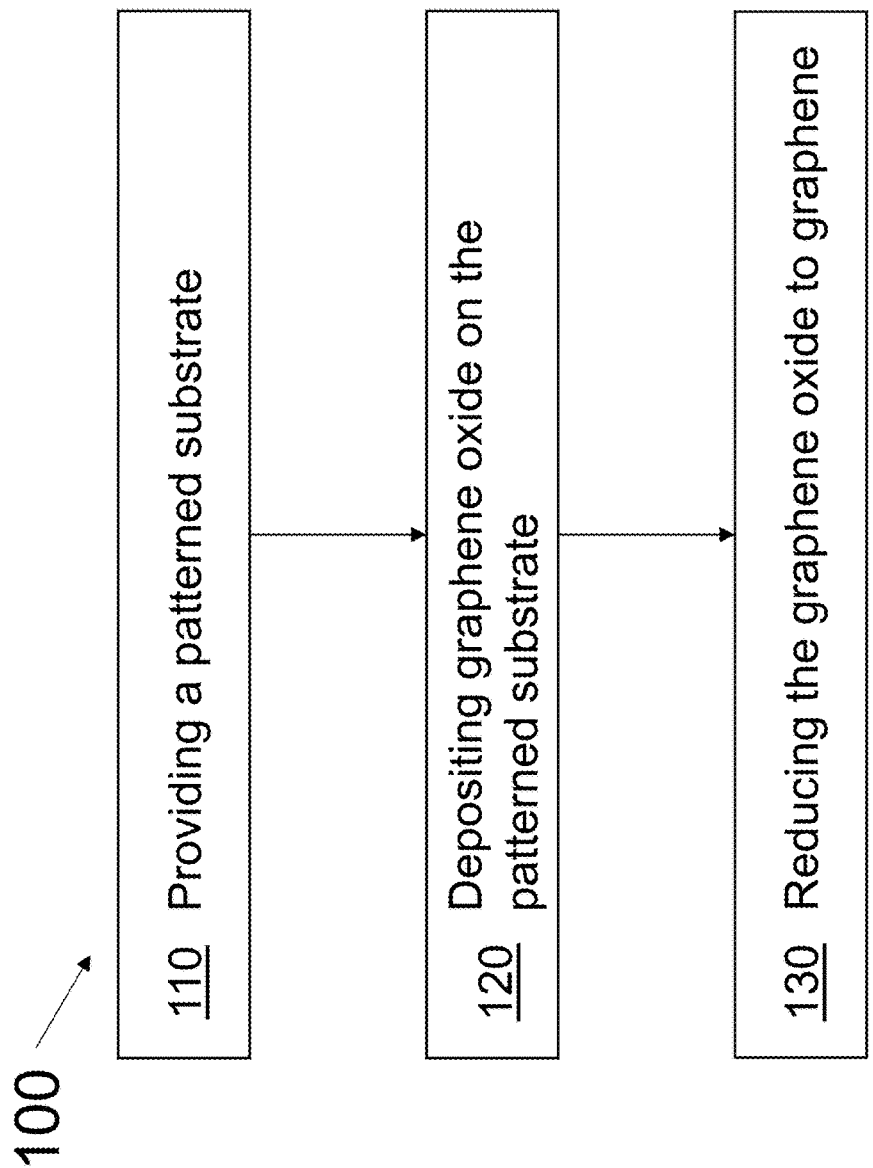
FIG. 1 is a flowchart of an exemplary method for the fabrication of graphene.

In one aspect, the invention relates to a method of producing a delaminated stable interconnected graphene structure. Exemplary process 100 is shown in FIG. 1. In step 110, a patterned substrate is provided. In step 120, graphene oxide is deposited on the substrate. In step 130, the graphene oxide on the substrate is reduced to graphene.

In one embodiment, in step 110, a patterned substrate is provided. The substrate can be of any material known to those of skill in the art, including but not limited to, metals, metal alloys, glasses/crystalline substrates, cloth, plastics, and combinations thereof. In one embodiment, the substrate comprises one or more plastic materials. In one embodiment, the substrate comprises one or more thermoplastic polymers. Thermoplastic polymers useful in the present invention include, but are not limited to, hydrophobic polymers and include polyolefins such as polyethylene, polypropylene, polybutylene, and combinations thereof. Other exemplary useful thermoplastic polymers include thermoplastic polyesters, polyurethanes and polyamides. In one embodiment, the thermoplastic polymer is a co-polymer, block co-polymer, or mixture of polymers. In one embodiment, the patterned substrate comprises a thermoplastic polyester. In one embodiment, the patterned substrate comprises polyethylene terephthalate (PET). In one embodiment, the patterned substrate is transparent.

In one embodiment, the patterned substrate includes structures comprising evenly spaced protrusions and/or indentations. In one embodiment, the structures have a shape selected from cylinders, triangle-based pyramids, square-based pyramids, half spheres, rectangular prisms, triangular prisms, pentagonal prisms, hexagonal prisms, cones, and combinations thereof. In one embodiment, the structures form a grid pattern on the substrate.

In one embodiment, the width of the structures is between 10 nm and 5 µm. In one embodiment, the structures are nano scale and the width of the structures is between 10 nm and 500 nm. In one embodiment, the width of the structure is between about 100 nm and about 500 nm. In one embodiment, the width of the structures is between about 100 nm and about 400 nm. In one embodiment, the width of the structures is about 180 nm. In one embodiment, the width of the structures is about 25 nm. In another embodiment, the width of the structures is about 50 nm.

In another embodiment, the structures are micro scale and the width of the structures is between 0.5 µm and 5 µm. In one embodiment, the width of the structures is between 1 µm and 3 µm. In one embodiment, the width of the structures is about 1.0 µm, 1.1 µm, 1.2 µm, 1.3 µm, 1.4 µm, 1.5 µm, 1.6 µm, 1.7 µm, 1.8 µm, 1.9 µm, 2.0 µm, 2.1 µm, 2.2 µm, 2.3 µm, 2.4 µm, 2.5 µm, 2.6 µm, 2.7 µm, 2.8 µm, 2.9 µm, or 3.0 µm.

In one embodiment, the distance between the structures, as measured from the center of adjacent structures (i.e., the pitch), is between 10 nm and 500 nm. In one embodiment, the distance between the structures is between 50 nm and 500 nm. In one embodiment, the distance between the structures is about 50 nm, 100 nm, 150 nm, 200 nm, 250 nm, 300 nm, 350 nm, 400 nm, 450 nm, or 500 nm.

In another embodiment, the distance between the structures, as measured from the center of adjacent structures (i.e., the pitch), is between 0.1 µm and 10 µm. In one embodiment, the distance between the structures is between 1 µm and 5 µm. In one embodiment, the distance between the structures is between 1 µm and 3 µm. In one embodiment, the distance between the structures is about 1.0 µm, 1.1 µm, 1.2 µm, 1.3 µm, 1.4 µm, 1.5 µm, 1.6 µm, 1.7 µm, 1.8 µm, 1.9 µm, 2.0 µm, 2.1 µm, 2.2 µm, 2.3 µm, 2.4 µm, 2.5 µm, 2.6 µm, 2.7 µm, 2.8 µm, 2.9 µm, or 3.0 µm. In one embodiment, the distance between the structures is about 0.4 µm.

In one embodiment, the height of the structures, as measured from the center of the structures, is between 10 and 500 nm. In one embodiment, the height is between 50 and 500 nm. In one embodiment, the height is about 500 nm. In one embodiment, the height is between 75 and 300 nm. In one embodiment, the height is between 100 and 200 nm.

In another embodiment, the height of the structures, as measured from the center of the structures, is between 0.2 µm and 100 µm. In one embodiment, the height of the structures is between 0.2 and 5 µm. In one embodiment, the height of the structures is between 0.3 µm and 4 µm. In one embodiment, the height of the structures is between 0.4 µm and 3 µm. In one embodiment, the height of the structures is between 0.5 µm and 3 µm. In one embodiment, the height of the structures is between 1 µm and 3 µm. In one embodiment, the height of the structures is about 1.0 µm, 1.1 µm, 1.2 µm, 1.3 µm, 1.4 µm, 1.5 µm, 1.6 µm, 1.7 µm, 1.8 µm, 1.9 µm, 2.0 µm, 2.1 µm, 2.2 µm, 2.3 µm, 2.4 µm, 2.5 µm, 2.6 µm, 2.7 µm, 2.8 µm, 2.9 µm, or 3.0 µm.

In one embodiment, the patterned substrate is fabricated using a master mold comprising a reciprocal pattern. The master mold can be of any material known in the art. In one embodiment, the master mold comprises quartz treated with laser interference lithography. In one embodiment, the surface of the master mold is silanized to render it hydrophobic and to facilitate removal of the patterned substrate from the master mold. The silanization can be performed using any technique known to those of skill in the art.

In one embodiment, substrate is contacted with the master mold and treated such that the substrate becomes imprinted with the pattern of the master mold. In one embodiment, the substrate is thermoformed to the master mold, such as by heating the master mold and the substrate. In one embodiment, the master mold is used in an injection molding process and heated substrate material is forced onto the master mold and cooled. In one embodiment, the master mold is used in a blow molding process and the air is forced into a heated substrate to conform it to the shape of the master mold. In one embodiment, the master mold is used in a rotational molding process, such that heated substrate and master mold are rotated to coat the surface of the master mold and the components are cooled.

In one embodiment, the patterned substrate is prepared via replica molding. In one embodiment, the master mold is contacted with the substrate, the substrate is contacted with a curable polymer, the curable polymer is cured, and the patterned substrate is removed from the master mold. The curable polymer can be any known to those of skill in the art, such as thermosetting polymers and photopolymers. In one embodiment, the curable polymer is a photopolymer. In one embodiment, the curable polymer may comprise one or more monomers, one or more oligomers, and additives. Exemplary photopolymers include acrylics, polyvinyl alcohol, polyvinyl cinnamate, polyisoprene, polyamides, epoxies, polyimides, styrenyl block copolymers, nitrile rubbers, and combinations thereof. In one embodiment, the curable photopolymer is Norland Optical Adhesive 61 (NOA 61). In one embodiment, the curable polymer is cured via exposure to UV light. In one embodiment, the curable polymer is cured via exposure to 200 mW cm$^{-2}$ UV light for 1 minute.

In step 120 of exemplary method 100, a mixture comprising graphene oxide is deposited on the patterned substrate. In one embodiment, mixture comprising graphene oxide is a suspension of graphene oxide in a solvent such as water. In one embodiment, the mixture comprising graphene oxide is a suspension of graphene oxide in water. In one embodiment, the mixture comprising graphene oxide may further comprise one or more additives that impart desired benefits on the resulting graphene.

In one embodiment, the suspension of graphene oxide comprises agglomerated stacks of graphene oxide. In one embodiment, the suspension of graphene oxide is subjected to physical agitation to separate the agglomerated stacks. Exemplary methods of agitation include, but are not limited to, stirring, ultrasonication, sparging with an inert gas, and combinations thereof. In one embodiment, the suspension of graphene oxide in water is subjected to an ultrasonic to separate he agglomerated stacks.

In some embodiments, the mixture comprising graphene oxide may further comprise additives that aid in the preparation of graphene. For example, an oxygen scavenging catalyst such as nickel, copper, silicon, or magnesium may scavenge oxygen during the deoxygenation reaction of the graphene oxide. This also results in a larger quantity of the crystalline graphene, as will be appreciated by those skilled in the art.

The mixture comprising graphene oxide may be deposited on the patterned substrate using any method known to those in the art. Exemplary methods for the deposition of a material on a substrate include spin coating, drop casting, pad printing, doctor blading, casting, screen printing, ink-jet printing, roll coating, brush coating, and the like. In one embodiment, the graphene oxide is drop-cast on the patterned substrate. In some embodiments of the invention, the graphene oxide is allowed to dry via evaporation. In some embodiments, heat may be applied to aid the drying process. In one embodiment, the graphene oxide mixture is dried open to air under ambient conditions.

In step 130 of exemplary process 100, the graphene oxide on the substrate is reduced to graphene. There are various methods for making this conversion as would be known to a person with ordinary skill in the art. Such methods include, but are not limited to, heating in an inert atmosphere, such as in hydrogen, methane, nitrogen, or argon to temperatures such as between 300° C. and 1200° C. Reduction can also be accomplished, for example, using a plasma assisted process at a voltage power between 500 and 2000 volts under less than one atmospheric pressure in the presence of hydrogen, methane, ammonia, argon or a mixture thereof. Laser processing, such as with the lightscribe method in an optical disk writer, xenon lamps, and photochemical processing using UV radiation can also be used to reduce graphene oxide to graphene. In one embodiment, the graphene oxide is reduced using a device capable of generating a brief flash of high intensity light. Exemplary devices include lasers, flash bulbs or lamps, arc lamps, electroluminescent lamps (e.g., light emitting diodes), gas discharge or electric glow discharge lamps (e.g., xenon flash lamps, neon and argon lamps), high-intensity discharge (HID) lamps (e.g., xenon arc lamps, mercury-vapor lamps, metal halide lamps), other sources of light, or combinations thereof. In one embodiment, the device is a xenon digital camera flash. In one embodiment, the flash energy from the flash is between 0.1 and 10 J cm$^{-2}$. In one embodiment, the flash energy is between 0.1 and 5 J cm$^{-2}$. In one embodiment, the flash energy is between 0.1 and 2 J cm$^{-2}$.

Delaminated Graphene

In one aspect, the present invention relates to multilayered graphene structures produced by the present method. As evidenced by the data provided herein, these graphene structures exhibit significant and unexpectedly superior properties compared to those formed using previously described methods. The instant invention is in part based on the unexpected observation that graphene oxide reduced on patterned substrates results in a greater spacing between layers and lower oxygen content.

In one embodiment, multilayered graphene structures produced using the methods of the present invention result in unexpectedly superior spacing between graphene layers. In one embodiment, the graphene structures of the instant invention are delaminated, in contrast to previous methods which result in compacted layers of graphene close to the surface of the substrate. In one embodiment, the graphene structures comprise no compacted layers. In one embodiment, the graphene structures in close proximity to the substrate are not compacted and there is separation between individual graphene layers. In one embodiment, the average spacing between layers is nearly constant throughout the graphene structures. In one embodiment, the average spacing between the layers of graphene is greater than 0.2 µm. In one embodiment, the average spacing is greater than about 0.4 µm. In one embodiment, the average spacing is greater than about 0.6 µm. In one embodiment, the average spacing is greater than about 0.8 µm. In one embodiment, the average spacing is greater than about 1.0 µm. In one embodiment, the average spacing is greater than about 1.2 µm. In one embodiment, the average spacing is greater than about 1.4 µm. In one embodiment, the average spacing is greater than about 1.6 µm. In one embodiment, the average spacing is greater than about 1.75 µm. In one embodiment, the average spacing is about 1.76 µm.

In one embodiment, graphene produced using the methods of the instant invention has an oxygen content (atomic percentage, or at. %) of less than 30 at. %. In one embodiment, graphene produced using the instant method has an oxygen content of less than 25 at. %. In one embodiment, graphene produced using the instant method has an oxygen content of less than 20 at. %. In one embodiment, graphene produced using the instant method has an oxygen content of less than 15 at. %. In one embodiment, graphene produced using the instant method has an oxygen content of less than 10 at. %. In one embodiment, graphene produced using the instant method has an oxygen content of less than 5 at. %. In one embodiment, graphene produced using the instant method has an oxygen content of about 4.2 at. %.

Electrodes of the Invention

In one aspect, the present invention relates to electrodes comprising graphene structures produced by the methods of the present invention. In one embodiment, the electrodes comprise graphene structures produced by the methods of the present invention and a substrate. In one embodiment, the electrodes comprise graphene structures produced by the methods of the present invention and a polyethylene terephthalate (PET) substrate.

In one embodiment, the electrodes comprising graphene structures produced by the methods of the present invention are used in a capacitor, pseudocapacitor, electrical double layer capacitor, or other energy storage device. In one embodiment, the electrodes comprising graphene structures produced by the methods of the present invention are used in a rechargeable battery, an ultrabattery, or a flow battery. In one embodiment, the electrodes comprising graphene structures produced by the methods of the present invention are used in a fuel cell.

In one embodiment, electrodes comprising graphene structures produced by the methods of the present invention are used in a supercapacitor. The supercapacitor comprising graphene structures produced by the methods of the present invention can be of any configuration known to those in the art. In one embodiment, the supercapacitor comprising graphene structures produced by the methods of the present invention is a sandwich-type device. In one embodiment, at least two electrodes comprising graphene structures produced by the methods of the present invention are immersed in an electrolyte solution and separated by a microporous membrane. The microporous membrane can be made from any material known by those of skill in the art. In one embodiment, the microporous membrane comprises polyethylene. In one embodiment, the electrodes comprising graphene structures produced by the present method are in contact with conducting current collectors. The current collector may be made of any conducting metal, including silver, gold, aluminum, copper, nickel, or combinations thereof. The current collector may be made of metal wires, metal nanowires, metal nanoparticles, or combinations thereof. In one embodiment, the current collector comprises copper tape.

For any of the embodiments described herein, the electrolyte may be any of aqueous liquid electrolytes, organic liquid electrolytes, ionic liquids and solids, polymer gel electrolytes, solid polymer electrolytes, and combinations thereof. In one embodiment, the electrolyte is 0.5 M $H_2SO_4$.

In one embodiment, at a current density of 100 mA $cm^{-3}$, the electrodes comprising the graphene of the instant invention exhibit a volumetric capacitance of between 400 and 1600 F $cm^{-3}$. In one embodiment, the electrodes exhibit a volumetric capacitance of between 400 and 1400 F $cm^{-3}$. In one embodiment, the electrodes exhibit a volumetric capacitance of between 600 and 1600 F $cm^{-3}$. In one embodiment, the electrodes exhibit a volumetric capacitance of between 800 and 1600 F $cm^{-3}$. In one embodiment, the electrodes exhibit a volumetric capacitance of between 1000 and 1600 F $cm^{-3}$. In one embodiment, the electrodes exhibit a volumetric capacitance of between 1200 and 1600 F $cm^{-3}$. In one embodiment, the electrodes exhibit a volumetric capacitance of between 1200 and 1300 F $cm^{-3}$. In one embodiment, the electrodes exhibit a volumetric capacitance of about 1200 F $cm^{-3}$ at a current density of 100 mA $cm^{-3}$. In one embodiment, the electrodes exhibit a volumetric capacitance of about 1224 F $cm^{-3}$ at a current density of 100 mA $cm^{-3}$. In one embodiment, the electrodes of the instant invention exhibit a volumetric capacitance of about 648.3 F $cm^{-3}$ at a current density of 2346 mA $cm^{-3}$ and above. In one embodiment, the electrodes comprising the graphene of the instant invention retain about 81% of their capacitance when the scan rate is increased from 10 mV $s^{-1}$ to 50 mV $s^{-1}$.

In one embodiment, electrodes comprising the graphene of the present invention exhibit a specific capacitance greater than 300 F $g^{-1}$. In one embodiment, the electrodes exhibit a specific capacitance greater than 300 F $g^{-1}$. In one embodiment, the electrodes exhibit a specific capacitance greater than 350 F $g^{-1}$. In one embodiment, the electrodes exhibit a specific capacitance greater than 400 F $g^{-1}$. In one embodiment, the electrodes exhibit a specific capacitance greater than 450 F $g^{-1}$. In one embodiment, the electrodes exhibit a specific capacitance greater than 500 F $g^{-1}$. In one embodiment, the electrodes exhibit a specific capacitance greater than 550 F $g^{-1}$. In one embodiment, the electrodes exhibit a specific capacitance greater than 600 F $g^{-1}$. In one embodiment, the electrodes exhibit a specific capacitance greater than 650 F $g^{-1}$. In one embodiment, the electrodes exhibit a specific capacitance of about 680 F $g^{-1}$. In one embodiment, the specific capacitance of the electrodes comprising the graphene of the instant invention is greater than the theoretical specific capacitance of pure single-layer graphene.

In one embodiment, electrodes comprising the graphene of the instant invention retain greater than 50% of their initial capacitance after 5000 cycles. In one embodiment, the electrodes retain greater than 55% of their initial capacitance after 5000 cycles. In one embodiment, the electrodes retain greater than 60% of their initial capacitance after 5000 cycles. In one embodiment, the electrodes retain greater than 65% of their initial capacitance after 5000 cycles. In one embodiment, the electrodes retain greater than 70% of their initial capacitance after 5000 cycles. In one embodiment, the electrodes retain greater than 75% of their initial capacitance after 5000 cycles. In one embodiment, the electrodes retain about 76.4% of their initial capacitance after 5000 cycles.

In one embodiment, electrodes comprising the graphene of the instant invention exhibit energy densities greater than 0.100 W h $cm^{-3}$. In one embodiment, the electrodes exhibit energy densities greater than 0.150 W h $cm^{-3}$. In one embodiment, the electrodes exhibit energy densities greater than 0.200 W h $cm^{-3}$. In one embodiment, the electrodes exhibit energy densities greater than 0.250 W h $cm^{-3}$. In one embodiment, the electrodes exhibit energy densities greater than 0.300 W h $cm^{-3}$. In one embodiment, the electrodes exhibit energy densities greater than 0.350 W h $cm^{-3}$. In one embodiment, the electrodes exhibit energy densities of about 0.370 W h $cm^{-3}$.

In one embodiment, electrodes comprising the graphene of the instant invention exhibit power densities greater than 10 W $cm^{-3}$. In one embodiment, the electrodes exhibit power densities greater than 100 W $cm^{-3}$. In one embodiment, the electrodes exhibit power densities greater than 200 W $cm^{-3}$. In one embodiment, the electrodes exhibit power densities greater than 300 W $cm^{-3}$. In one embodiment, the electrodes exhibit power densities greater than 400 W $cm^{-3}$. In one embodiment, the electrodes exhibit power densities of about 416.6 W $cm^{-3}$.

EXPERIMENTAL EXAMPLES

The invention is now described with reference to the following Examples. These Examples are provided for the purpose of illustration only, and the invention is not limited to these Examples, but rather encompasses all variations that are evident as a result of the teachings provided herein.

Figure 2:
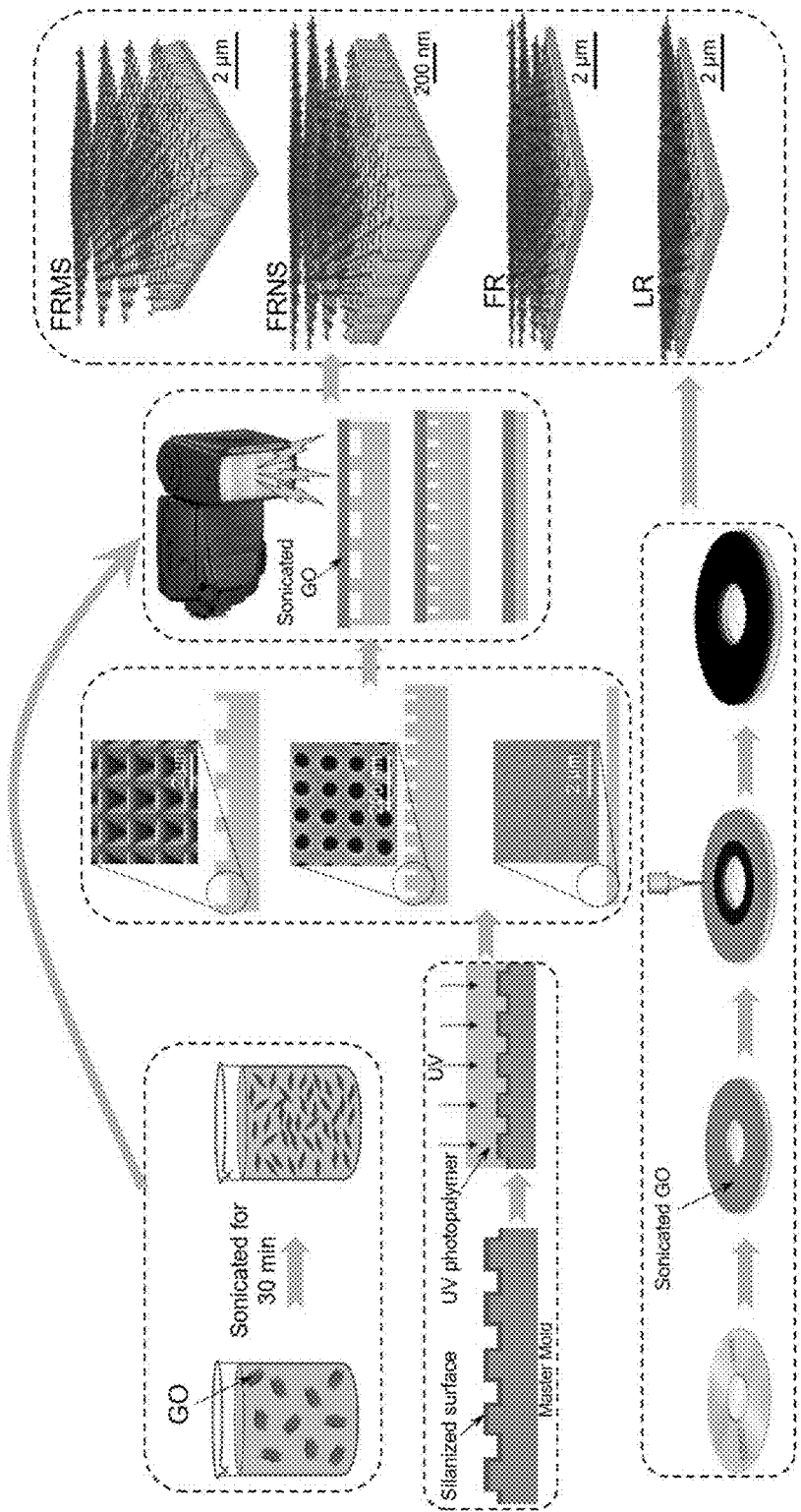
FIG. 2 is a schematic illustration of exemplary flash and laser reduction preparation methods.

Example 1: Fabrication of Stable Interconnected Graphene Networks Via Reduction of Graphene Oxide Materials and Methods High quality graphene oxide (GO) (Graphenea Inc., Cambridge, Mass.) with a monolayer content of >95% was dispersed in water at a concentration of 4 mg $mL^{-1}$. In order to exfoliate the agglomerated stacks of GO, the precursor was subjected to an ultrasonic bath for 30 min. Transparent polyethylene terephthalate (PET) was used as the substrate for producing the electrochemical electrodes. A replica molding process was used to create the nano and micro patterns on the plastic substrate. Master molds made by laser interference lithography on a quartz substrate were silanized for 30 min to render them hydrophobic. A PET sheet was placed on the master mold, followed by 2 mL of a UV-curable polymer (NOA-61, Sigma Aldrich). The assembly was subjected to UV light at a power of 210 mW cm$^{-2}$ for 1 min. The fixing of the UV-curable polymer generated periodic patterns on the PET. The plastic was then gently peeled from the master mold (FIG. 2).

For the production of flash reduced graphene, 20 mL of the graphene oxide (GO) mixture in water was drop-cast onto the surface of patterned and flat plastic substrates and dried overnight at room temperature. A xenon digital camera flash (Neewer PRO i-TTL) was used under air and ambient conditions for the reduction of GO to graphene. The flash energy was approximately 0.1-2 J cm$^{-2}$, as measured by a Gentec QE25ELP-S-MB-INT-DO light measurement system. After flashing, the golden-brown color of GO turned to black, which is evidence of successful reduction of GO to graphene. Laser reduced samples were fabricated using a LG lightscribe DVD burner employed by means of a regular lightscribe software. Drop-cast GO on a PET substrate was glued to the top surface of a lightscribe DVD and burnt in a DVD optical drive. The process was repeated eight times at about 20 min a cycle. After the preparation of electrodes, three electrode configuration tests were performed in 0.5 M H$_2$SO$_4$ electrolyte with Pt and Hg/Hg$^+$ as working and reference electrodes, respectively. Fabricated electrodes were named LR (laser reduced), FR (flash reduced on flat substrate), FRNS (flash reduced on nano-patterned substrate) and FRMS (flash reduced on micro-patterned substrate).

Sandwich type devices were produced using LR, FR, FRNS and FRMS electrodes using a microporous membrane and 0.5 M H$_2$SO$_4$ electrolyte. Electrochemical tests including cyclic voltammetry (CV) and galvanostatic charge/discharge were performed by CHI 600E electrochemical workstation. Electrochemical Impedance Spectroscopy (EIS) measurements were carried out with amplitude of 0.005 V AC in the range of 0.01 Hz to 100 k Hz. Volumetric capacitance was calculated using equation 1 (Wen, et al., Carbon, 2014, 75, 236-243), where υ, i, ΔV and v are defined as scan rate (V s$^{-1}$), applied current (A), sweep potential window (V) and volume of active material (cm$^3$), respectively.

$$C_v = \frac{\int i \cdot dV}{v \cdot \Delta V \cdot \upsilon} \quad (1)$$

For calculating volumetric capacitance (F·cm$^{-3}$) from the charge/discharge diagrams, equation 2 (Wen, et al., Carbon, 2014, 75, 236-243) was used.

$$C_v = \frac{-idt}{VdV} \quad (2)$$

Specific energy density E (W·h·cm$^{-3}$) and power density P (W·cm$^{-3}$) were calculated using equation 3 (El-Kady and Kaner, Nat. Commun., 2013, 4, 1475) and equation 4 (El-Kady and Kaner, Nat. Commun., 2013, 4, 1475), where t is the discharge time excluding IR drop.

$$E = \frac{C_v \times (\Delta V)^2}{3600} \quad (3)$$

$$P = \frac{E \times 3600}{\Delta t} \quad (4)$$

Figure 3:
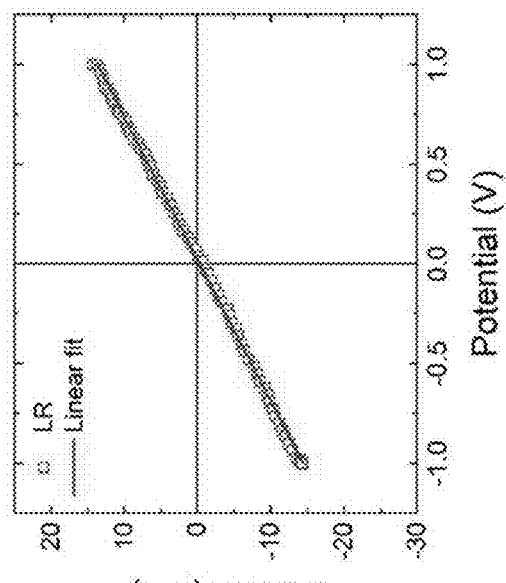
FIG. 3, comprising
Figure 3:
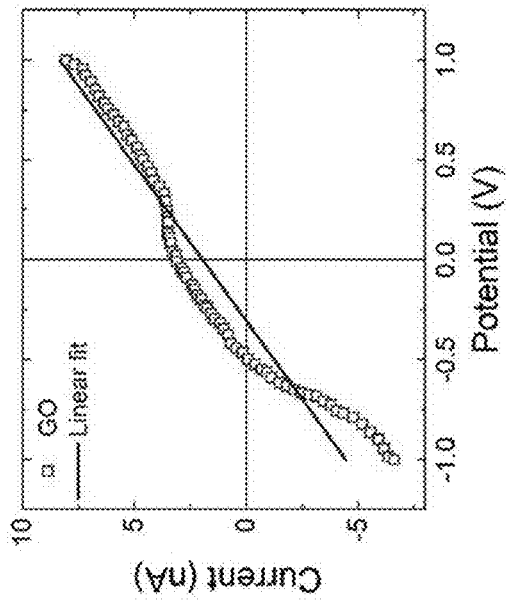
Figure 3:
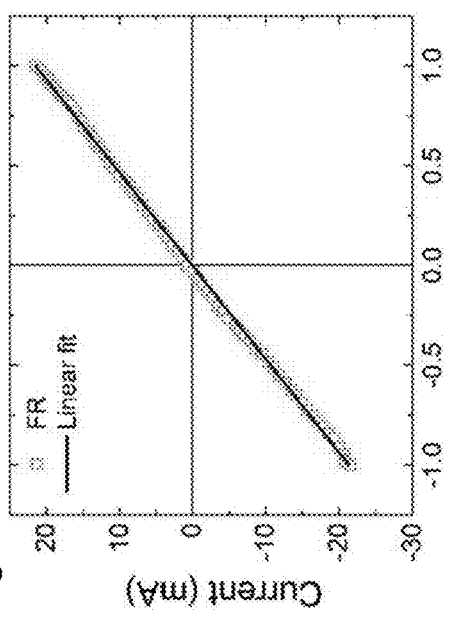

The conductivity of LR and FR GO was measured by performing CV tests in the potential window of −1 to 1 V and scan rate of 0.1 V s$^{-1}$. The electrical conductivity of the GO surface was measured (FIG. 3) to be 6.38×10$^{-4}$ S·m$^{-1}$. After laser reduction and flash reduction, the electrical conductivity increased to 1.40×10$^3$ and 2.14×10$^3$ S·m$^{-1}$, respectively.

Morphological, Energy-dispersive spectroscopy (EDS) and cross sectional studies were performed by scanning electron microscopy (Quanta 3D DualBeam FEG FIB-SEM). X-ray diffraction was performed using a Panalytical Empyrean multipurpose diffractometer. An Anasys atomic force microscope was employed to study surface properties. A Renishaw inVia confocal Raman microscope was used to measure Raman spectra. All spectra were acquired using an excitation wavelength of 532 nm and measured in the range of 500-3000 cm$^{-1}$. For X-ray photoelectron spectroscopy (XPS) analysis, a Scienta Omicron ESCA 2SR instrument equipped with a monochromatic Al Kα X-ray source of 1486.7 eV was employed. Altamira AMI-200 was employed for Brunauer-Emmett-Teller (BET) experiments. Samples of 1 mg were used for surface area measurements and further calculations.

The results of the experiments will now be discussed.

Figure 4:
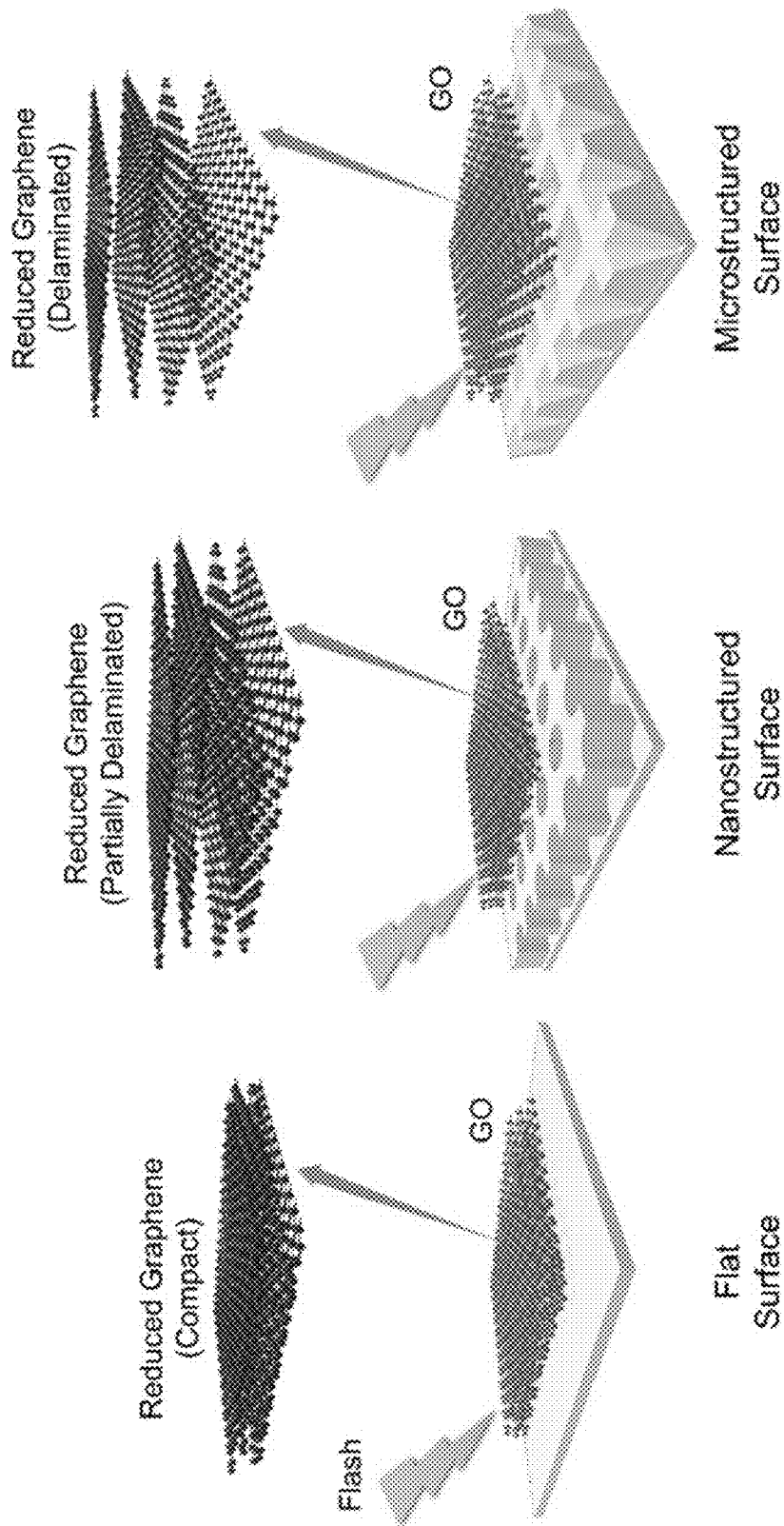
FIG. 4 is a schematic illustration of the substrate engineering effect on electrodes for energy applications using flash reduction on flat and patterned substrates. By means of substrate engineering, the interlayer spacing of graphene layers increases considerably. Therefore, the diffusion of the electrolyte into the interconnected graphene structure is facilitated.
Figure 6:
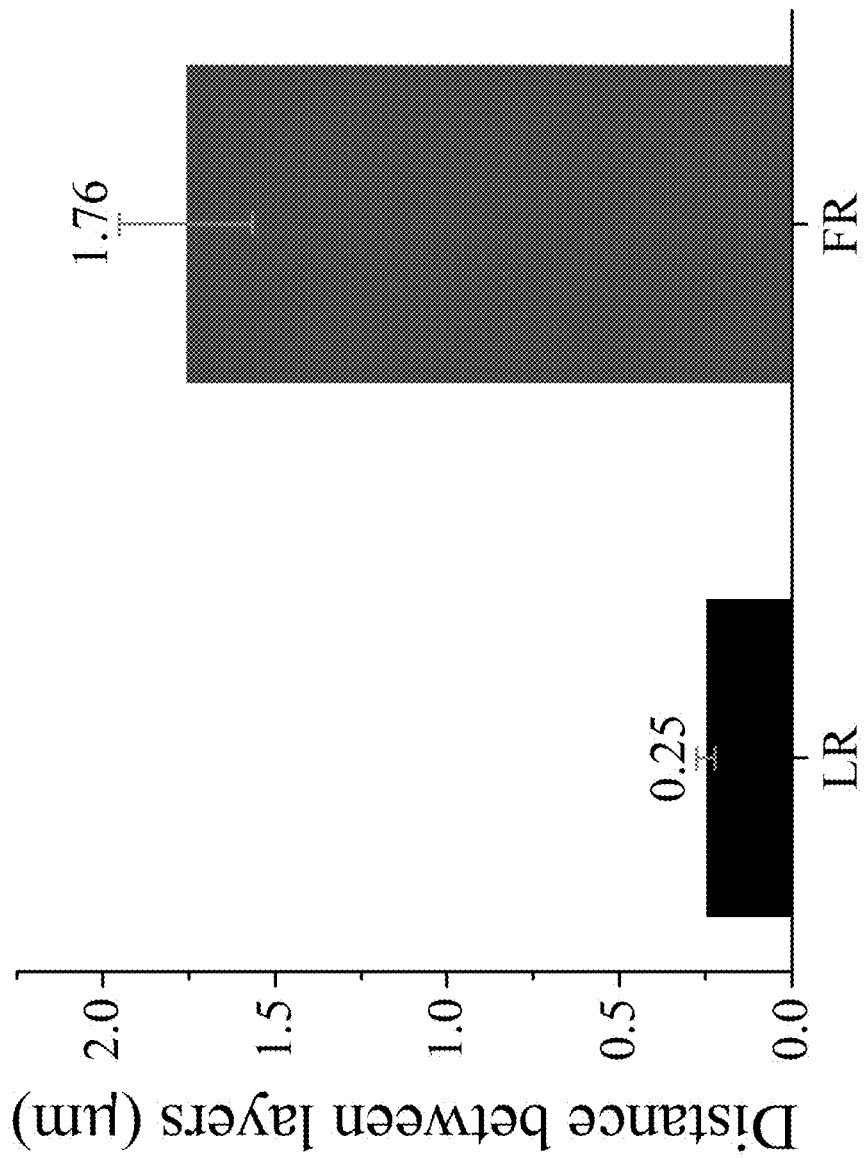
FIG. 6 is a plot of the average distance between graphene layers reduced by laser (LR) and flash (FR) based on the analysis of cross-sectional SEM images. The results were obtained by image analysis of ten different locations on the cross-sectional images for each sample. The laser reduced sample exhibits a compact structure with the mean interlayer spacing of 0.25 µm. The flash reduced sample shows an average interlayer spacing of 1.75 µm.
Figure 7:
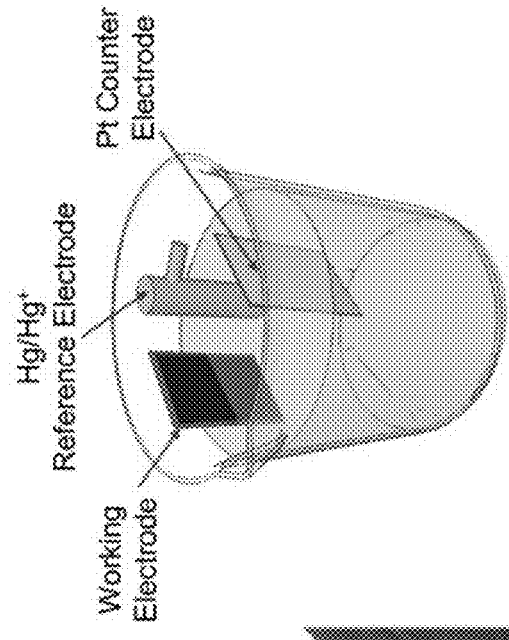
FIG. 7 depicts device and experimental setup for the flash reduced graphene capacitors.
Figure 7:
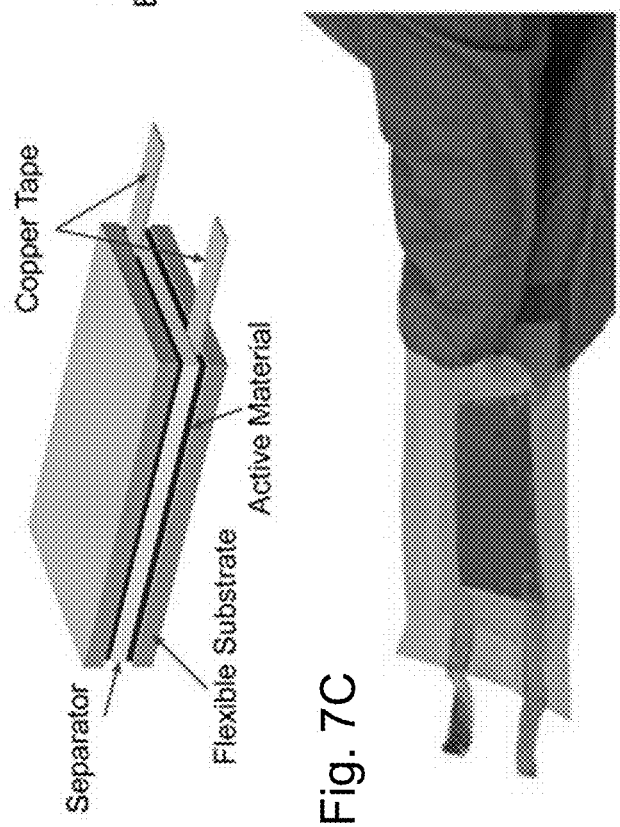
Figure 8:
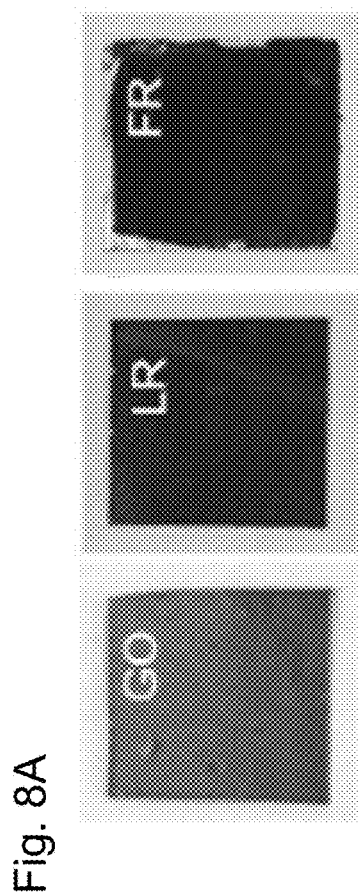
FIG. 8, comprising
Figure 8:
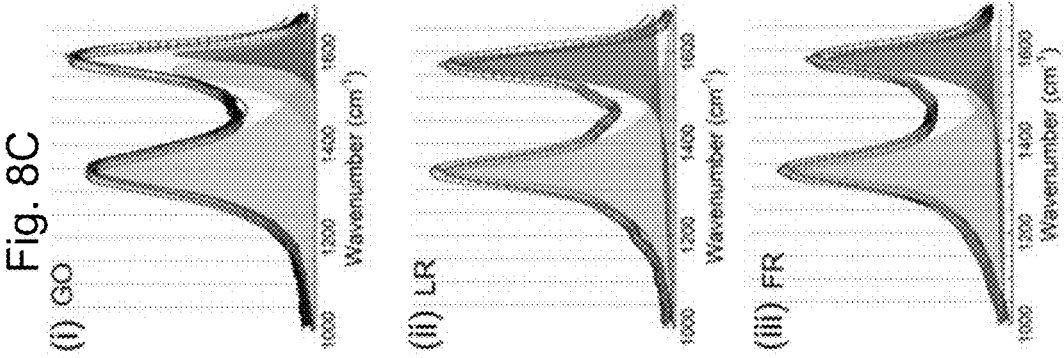
Figure 8:
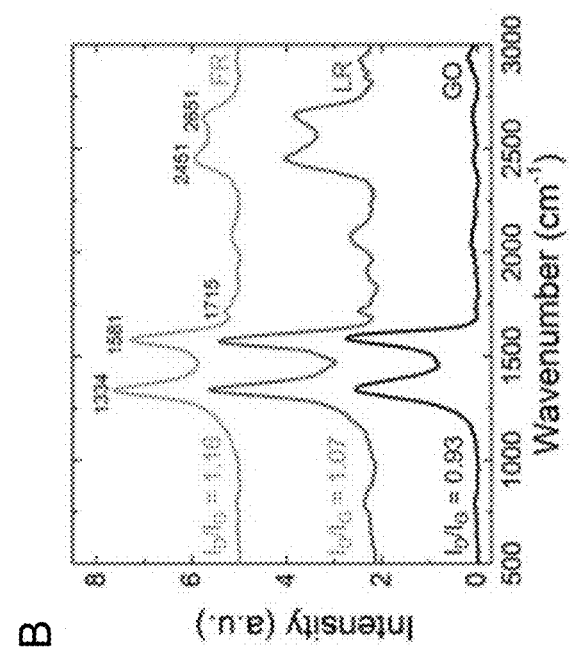

FIG. 4 shows schematically the formation of interconnected graphene layers on top of flat, nano and micro-structured pattern substrate. A xenon digital camera flash was used to produce the graphene from graphene oxide (GO) (FIG. 2). The fabricated electrodes were named FR (flash reduced on flat substrate), FRNS (flash reduced on nano-patterned substrate) and FRMS (flash reduced on micro-patterned substrate). In order to compare the performance of the flash-reduced electrodes, GO was also reduced using the lightscribe DVD technique to produce laser reduced (LR) graphene. FIG. 5A and FIG. 5B shows the cross-sectional SEM images of LR and FR graphene, respectively. The distance between graphene layers at ten different places on each sample was analyzed. The LR sample shows an average spacing of 0.25 μm, and the FR sample shows an average spacing of 1.76 μm (FIG. 6). The delamination of interconnected multi layered graphene structures enhances electrochemical devices by providing a highly porous architecture that facilitates the wettability of active material and results in rapid ion transfer and greater effective surface area for double layer capacitance (Exemplary capacitor diagrammed in FIG. 7A and photographed in FIG. 7C). Electrochemical experiments utilized a three-electrode configuration (FIG. 7B). A color change from brown (for GO) to black (for LR and FR) represents first evidence of the successful conversion of GO to graphene, which is shown in FIG. 8A. The electrical surface resistance of the device was measured before and after the reduction process. The electrical conductivity of the GO surface was measured to be 6.38×10$^{-4}$ S m$^{-1}$ (FIG. 3A), and after reduction, the conductivity increased to 1.40×10$^3$ for the LR process (FIG. 3B) and 2.14×10$^3$ S·m$^{-1}$ for the FR process (FIG. 3C).

Another parameter that affects the overall functionality of graphene-based supercapacitors is the amount of GO converted to graphene during the conversion process when using GO as the starting material. FIGS. 5C and 5D show XRD results for the LR and FR samples, respectively. A thin layer of Vaseline® was used to adhere LR sample to the sample holder and keep it flat. The results were compared with the XRD of graphite, graphene, and GO. The XRD pattern of FR shows two characteristic peaks. The broad peak at 2θ=26° with a d-spacing of 3.42 Å is generally associated with the graphitic peak (Mishra, et al., Sens. Actuators, B 2014, 199, 190-200; Lu, et al., J. Mater. Chem. 2012, 22, 8775-8777; Dikin, et al., Nature 2007, 448, 457-460). The other peak occurred at the same position as that of LR sample's characteristic peak. The XRD pattern of LR shows a characteristic peak of 2θ=10.09°, which corresponds to a d-spacing of 8.76 Å. This peak is generally associated with GO. The oxygen-containing functional groups in GO are responsible for the increased d-spacing seen in the XRD of LR samples (Buchsteiner, et al., J. Phys. Chem. B 2006, 110, 22328-22338; Lerf, et al., J. Phys. Chem. Solids 2006, 67, 1106-1110; Fang, et al., *RSC Adv.* 2017, 7, 25773-25779). The LR graphene structures show a considerable amount of residual graphene oxide ($I_{GO}/I_G \approx 11.14$, $I_{GO}$: intensity of the GO peak, $I_G$: intensity of the graphene peak) compared to the FR graphene structures ($I_{GO}/I_G \approx 0.77$). This residual GO negatively influences the electrochemical properties of supercapacitors and reduces the amount of capacitance achievable by the device. When GO reduction is used in the manufacture of interconnected graphene structures, the amount of residual GO must be considered.

Raman spectra of LR and FR samples are provided in FIG. 8B and FIG. 8C. The appearance of 2D peaks at ~2651 $cm^{-1}$ in the Raman spectra of LR and FR samples is further evidence of the conversion of GO to graphene, as the 2D peak is absent in the GO Raman spectrum (FIG. 8B). The G-band and D-band appear for all the samples. The G-band of the LR and FR samples (1572 $cm^{-1}$ and 1581 $cm^{-1}$, respectively) are shifted to a lower frequency compared to the G-band of the GO sample (1585 $cm^{-1}$). This result indicates topological disordering of two-dimensional graphene layers and formation of 3D structures in FR samples. Another indication of 3D structure formation can be derived from the change in the $I_D/I_G$ ratio. The $I_D/I_G$ intensity ratio of GO was 0.93, increased to 1.07 for the LR sample, and further increased to 1.16 for the FR sample. The change in $I_D/I_G$ ratio indicates that the of the grain size of the $sp^2$ domains decreased while the aromatic ring remains intact during the reduction of GO (Fan, et al., Carbon 2010, 48, 1686-1689) and the elimination of oxygen-containing functional groups (Tung et al., Nat. Nanotechnol. 2009, 4, 25-29). Similar observations were also reported for reduced GO in the previous studies (Vollebregt, et al., Carbon 2012, 50, 3542-3554). The G-band represents an in-plane stretching vibration mode of $sp^2$ sites (i.e., double bond carbon atoms) and the D-band represents a breathing vibration mode of $sp^2$ sites. A greater number of phonons participate in the vibration due to the decrease in grain size, and hence, the intensity of the G-band decreases. Because the line widths of the D and G peaks were different in all the samples, the first-order Raman spectra were deconvoluted to reveal three peaks: two peaks appearing at the D- and G-band positions and a third peak, denoted as D*. The D* peak is interpreted as the amorphous $sp^3$ content (e.g., single bond carbon such as in C—OH) (Claramunt, et al., J. Phys. Chem. C 2015, 119, 10123-10129; Zhu, et al., Adv. Mater. 2010, 22, 3906-3924). FIG. 8C shows the positions of the D* band: GO [1563.5 $cm^{-1}$, full width at half-maximum (fwhm)=80.9 $cm^{-1}$], LR (1510.4 $cm^{-1}$, fwhm=99.8 $cm^{-1}$), and FR (1498.7 $cm^{-1}$, fwhm=127.9 $cm^{-1}$). The D* peak shifts toward lower frequencies (wavenumbers) upon decreasing oxygen content (Han, et al., *Adv. Mater.* 2014, 26, 849-864; Zhu, et al., *Adv. Mater.* 2010, 22, 3906-3924). Compared to GO (1563.5 $cm^{-1}$), the D* peak moved to a lower frequency for the FR samples (1498.7 $cm^{-1}$). This result provides further confirmation that the oxygen content is lower in the FR sample compared to that of both the GO and LR samples.

Figure 9:
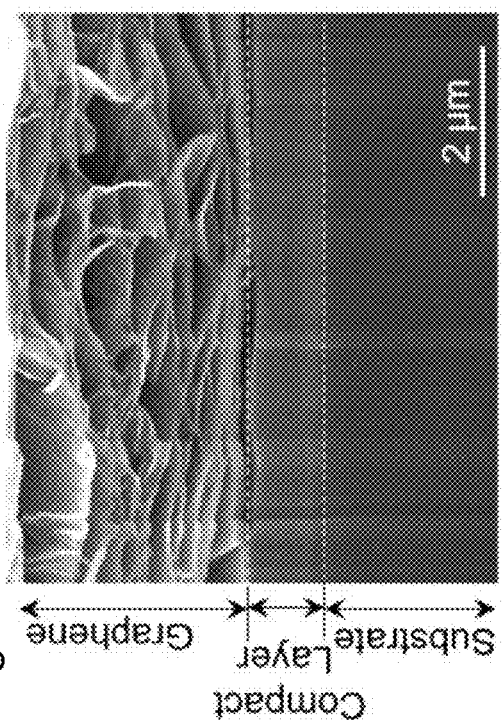
FIG. 9, comprising
Figure 9:
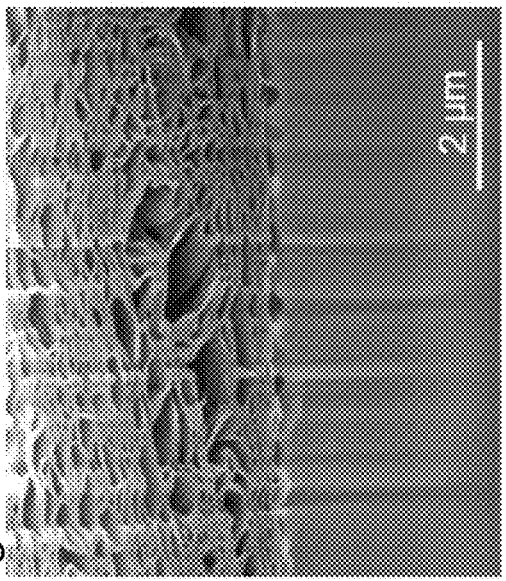
Figure 9:
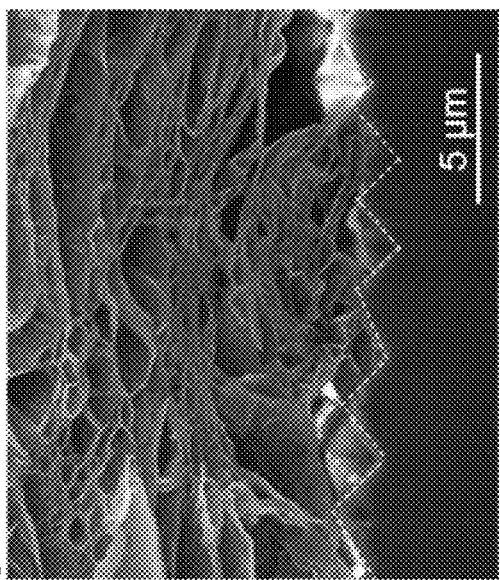
Figure 10:
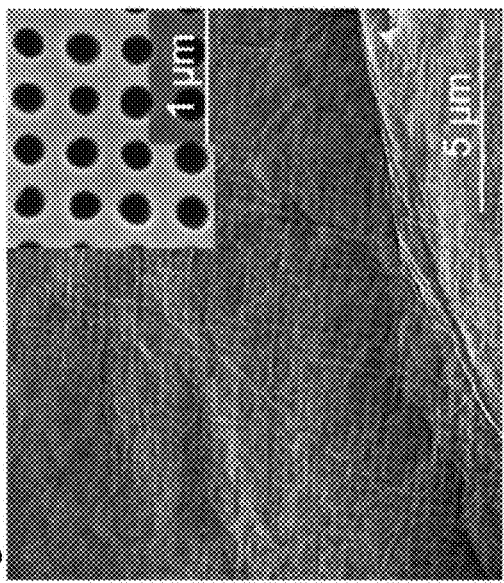
FIG. 10, comprising
Figure 10:
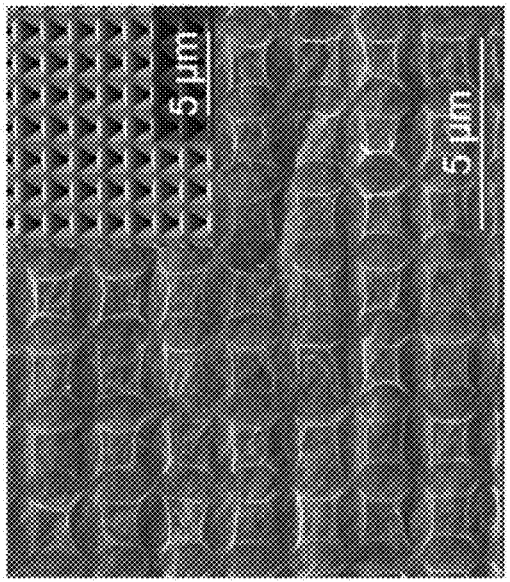
Figure 10:
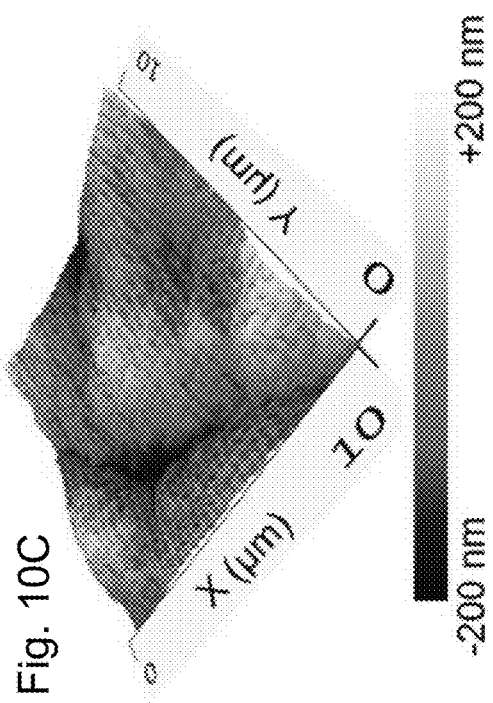

The surface structure of the substrate is often neglected in the study of electrochemical energy storage devices, though it plays an important role. The substrate, which is used as a platform for reducing the GO, can significantly affect the interlayer spacing and the degree of GO conversion. FIG. 9 shows the effect of supporting substrate on the interlayer spacing. Three differently patterned plastic substrates were used to convert GO to graphene using flash reduction. In the case of the FR graphene, which was exposed to flash light on a non-patterned substrate (FIG. 9A), the lower layers of graphene at the interface of the active material and the substrate were found to be compressed. Delamination of graphene layers occurred only in the top layers, about 2 μm above the substrate. Conversely, a highly delaminated interconnected graphene structure was obtained when patterned substrates (nano and micro substrates) were used (FIGS. 9B and 9C), with a high degree of delamination immediately above the substrate surface. While not wishing to be bound by any particular theory, it is possible that the nano and micro substrates provide extra space for the expansion of layers and allow an escape path for oxygen gas generated in the GO reduction process. The delamination of graphene sheets was more apparent when the pattern size was increased from hundreds of nanometers to a few microns. The average graphene interlayer distance increased from 0.8 to 2.2 μm while using a micropatterned structure instead of a nonpatterned structure. FIG. 10A, FIG. 10B, and FIG. 10C show the surface of drop-cast GO that was in contact with micro- and nano-patterned substrates. The periodic structures are clearly visible by SEM and atomic force microscopy (AFM). The insets of FIG. 10A and FIG. 10B show SEM images of the respective micro- and nanostructures. The microstructure is inverse pyramid-shaped with a pitch of 2 μm and a depth of 1.2 The nanostructure is a nanohole periodic structure with a pitch of 350 nm, a hole diameter of 180 nm, and a hole depth of 500 nm.

Figure 11:
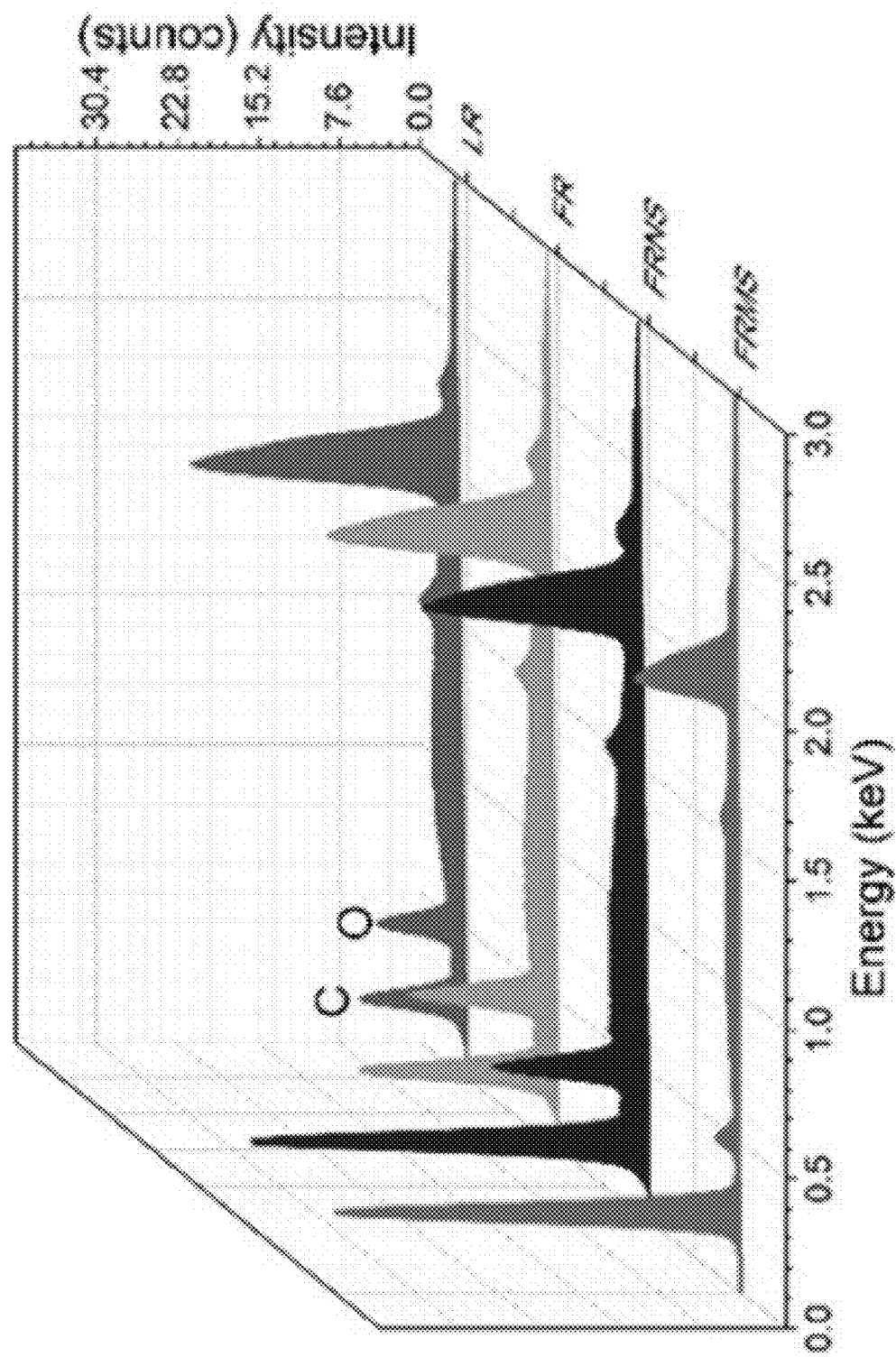
FIG. 11 is a 3D plot of EDS analysis shows a dramatic difference in the oxygen and carbon content of the LR, FR, FRNS, and FRMS electrode samples.
Figure 12:
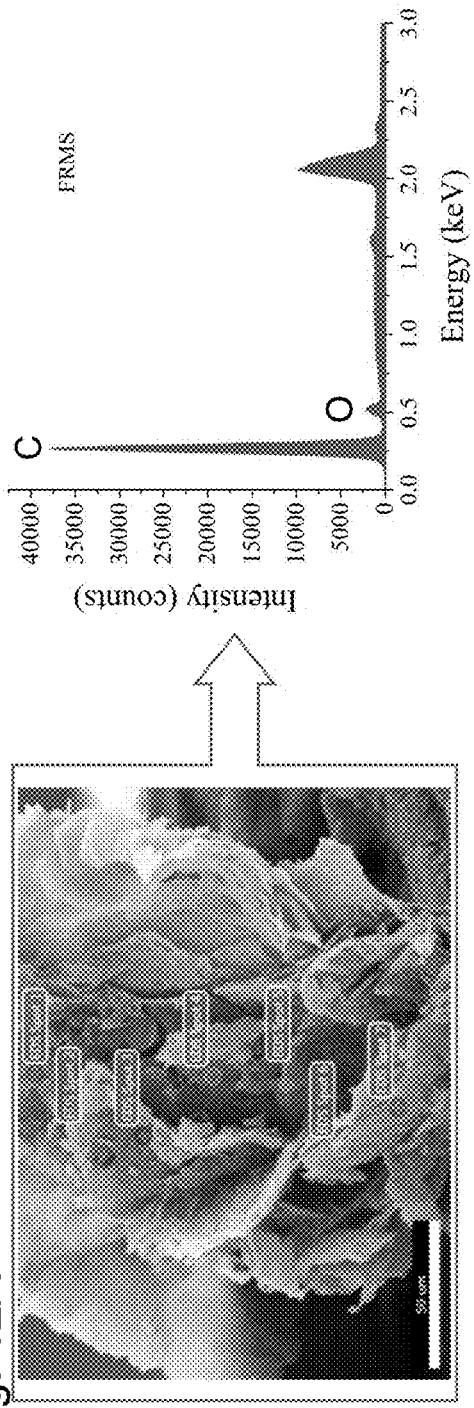
FIG. 12, comprising
Figure 12:
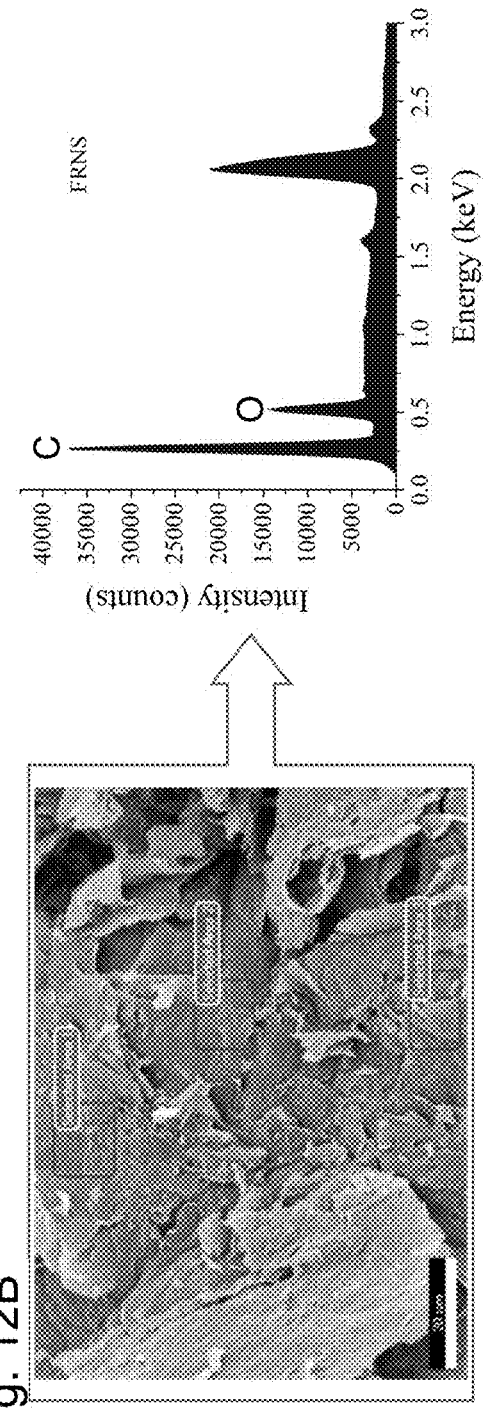
Figure 13:
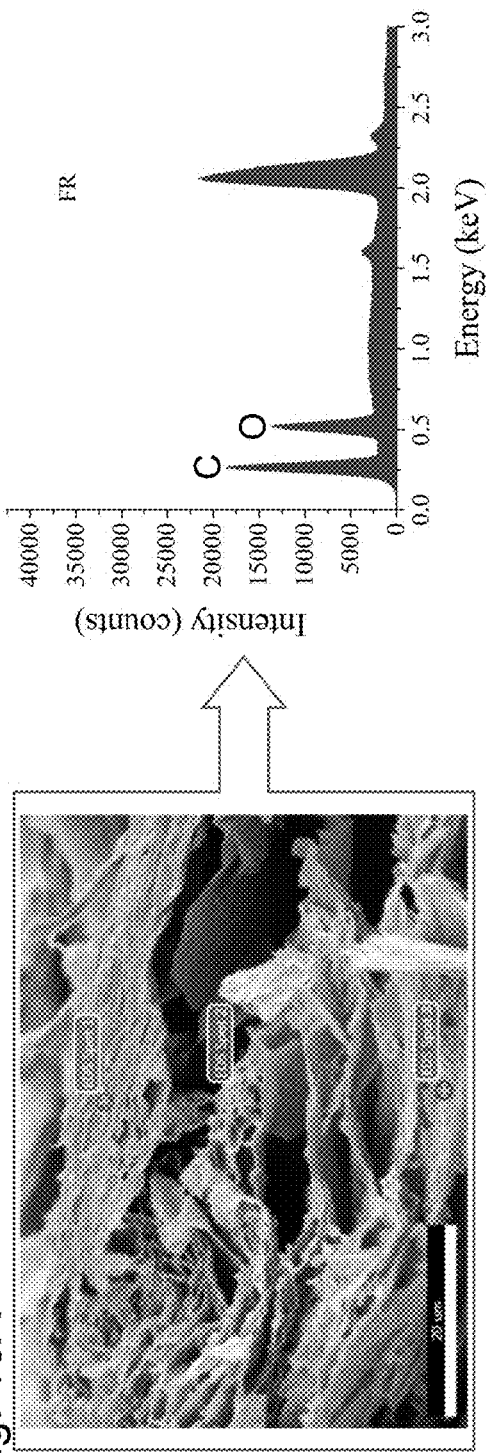
FIG. 13, comprising
Figure 13:
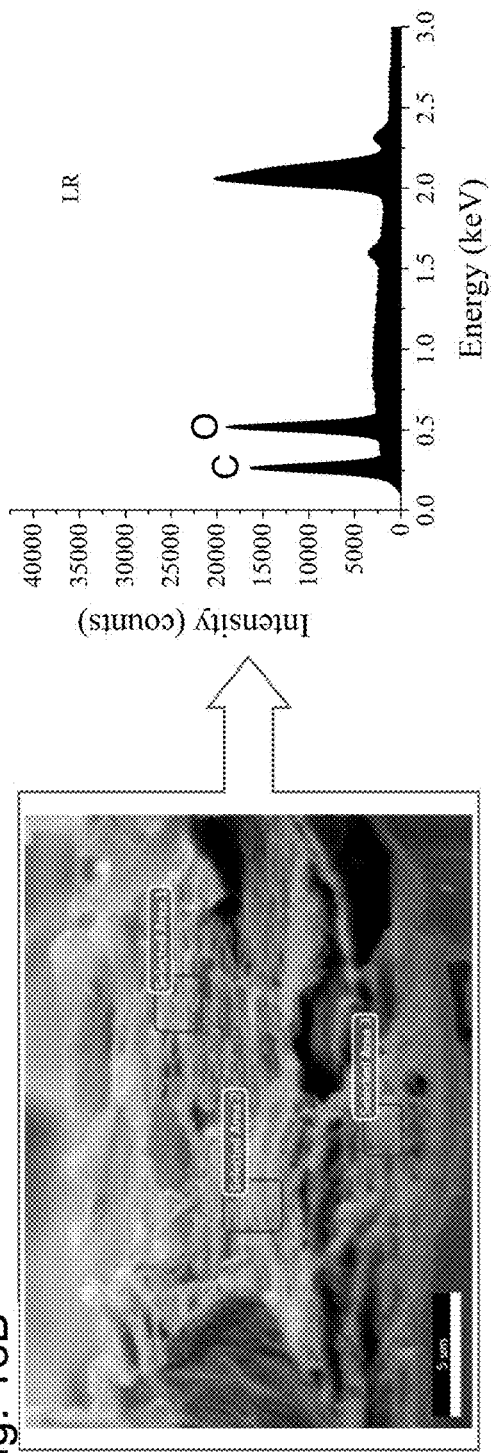
Figure 14:
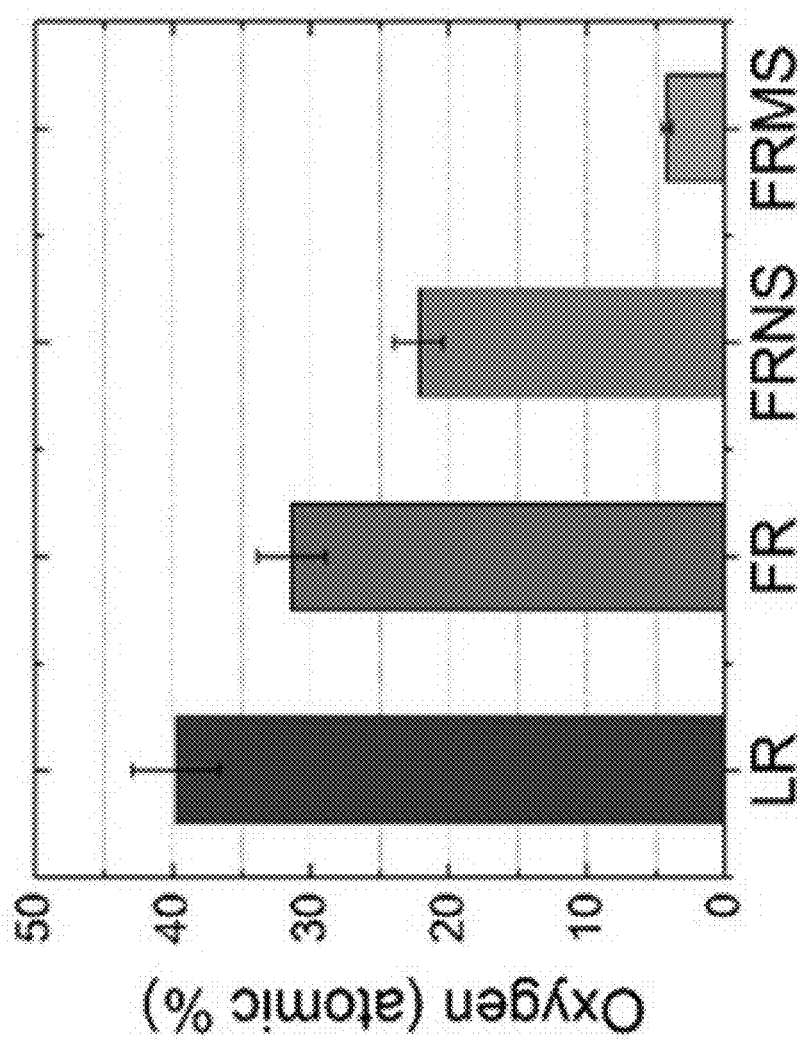
FIG. 14 is a comparison of oxygen atom content in each of the four electrode samples. The LR electrode shows the highest amount of residual oxygen (39.8%), and the FRMS sample represents the lowest value (4.2%). The amount of residual oxygen decreases dramatically from LR to the FRMS sample.

FIG. 11 illustrates the X-ray EDS spectral analysis results obtained for different types of samples inside the SEM to determine the amount of residual oxygen, which is directly correlated to residual GO (For individual plots and layer construction see FIG. 12 and FIG. 13). For all samples, three prominent peaks were observed. The peak at around 0.270 keV can be assigned to C, the peak at 0.521 keV can be assigned to 0, and the peak at 2.06 keV is due to the Pt used in SEM to reduce the charging effect during imaging. From the analysis, the LR specimen showed the highest value of residual oxygen (39.8 at. %) (FIG. 14). FRMS dramatically decreases the residual oxygen to 4.2 at. %. Thus, the presence of micro- and nanostructures on the substrate surface during the GO reduction process enhances oxygen depletion, which results in an expanded interconnected network of graphene. In order to provide further evidence about the difference in the oxygen content, high-resolution XPS C is spectrum analysis was performed for all samples, which allows for investigation of the surface chemical properties of carbon and oxygen atoms. The XPS C is spectra for LR, FR, FRNS, and FRMS samples are shown in FIG. 15A, FIG. 15B, FIG. 15C, and FIG. 15D, respectively.

Figure 15:
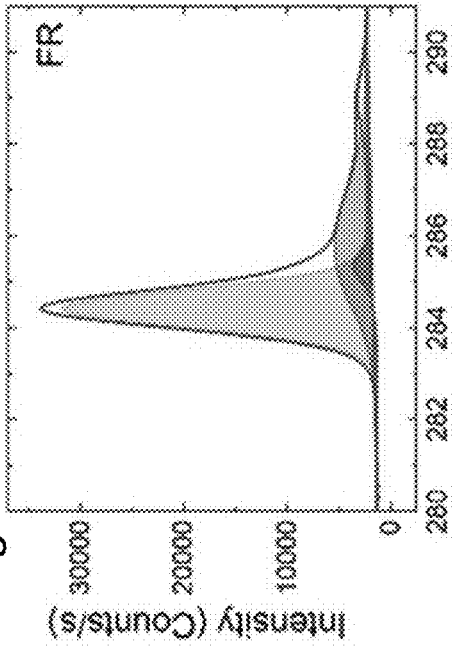
FIG. 15, comprising
Figure 15:
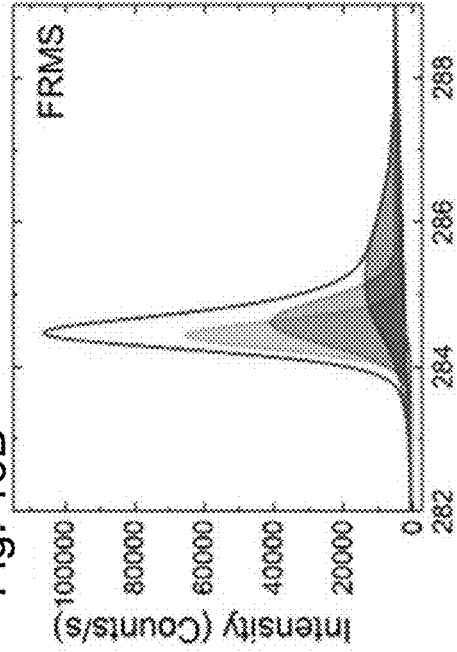
Figure 15:
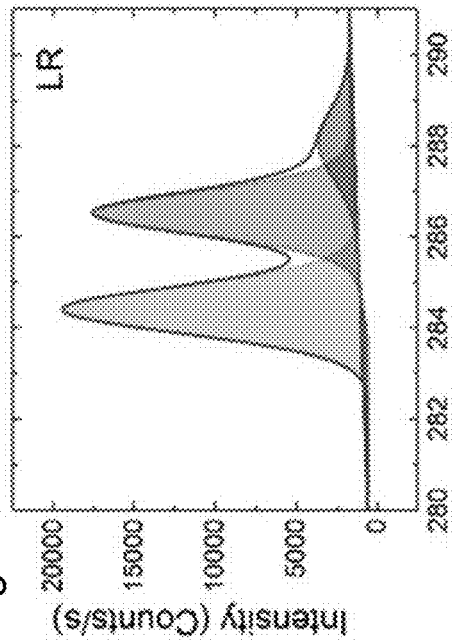
Figure 15:
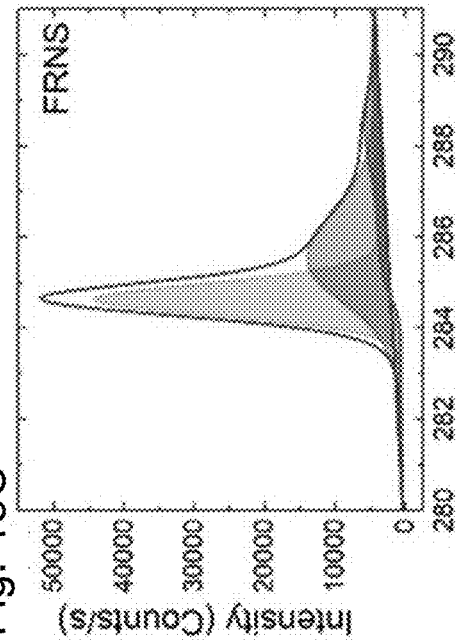
Figure 16:
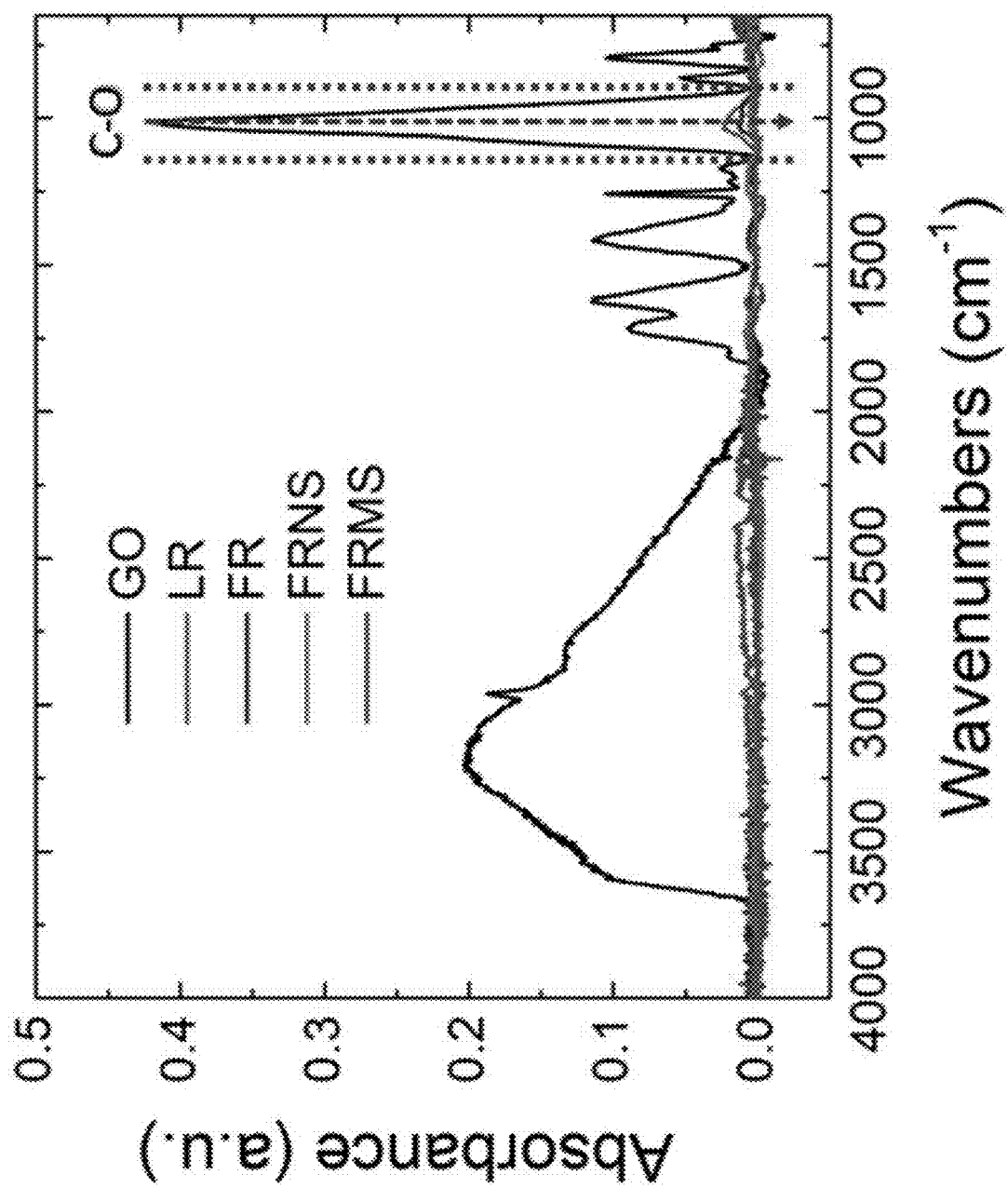
FIG. 16 is an overlay of the FTIR-ATR spectra of GO, LR, FR, FRNS and FRMS showing the considerable reduction of oxygen species after using of patterned substrates.

All the spectra were deconvoluted into four distinct peaks (FRNS, FIG. 15C, and FRMS, FIG. 15D, each showed only three peaks). Distinctive peak shapes and identities clearly demonstrate different surface properties among LR, FR, FRNS, and FRMS samples. The XPS peak positions and the corresponding bond assignment are as follows: the LR sample has a peak at 284.38 eV (C C), 286.54 eV (C—OH, C—O—C), 287.35 eV (O—C=O), and 288.06 eV (C=O); the FR has a peak at 284.39 eV (C=C), 285.33 eV (C—C, sp$^3$ C), 285.77 eV (C—O), and 288.96 eV (O—C=O); FRNS has a peak at 284.6 eV (C=C), 285.54 eV (C—C), and 288.47 eV (O—C=O); and FRMS has a peak at 284.4 eV (C=C), 284.61 eV (C=C), and 285.18 eV (C—C, sp$^3$ C). The assignment of the bonds is in agreement with the literature values (El-Kady and Kaner, Nat. Commun. 2013, 4, 1475). Previous studies have suggested that laser reduction method of GO is not capable of removing oxygen-containing functional groups efficiently (Yang and Bock, J. Power Sources 2017, 337, 73-81). Remarkably, the FRMS process removed most of the oxygen-containing functional groups compared to other synthesis methods. From XPS analysis, the oxygen contents of LR, FR, FRNS, and FRMS samples were found to be 34.3, 29.9, 15.9, and 4.9 at. %, respectively, which are in close agreement with the values found from the EDS analysis (FIG. 14). The decrease in oxygen content in FRNS and FRMS samples demonstrates that employing a flash reduction technique on nano- and microstructured substrates leads to enhanced conversion of GO to graphene (see also FIG. 16).

Figure 17:
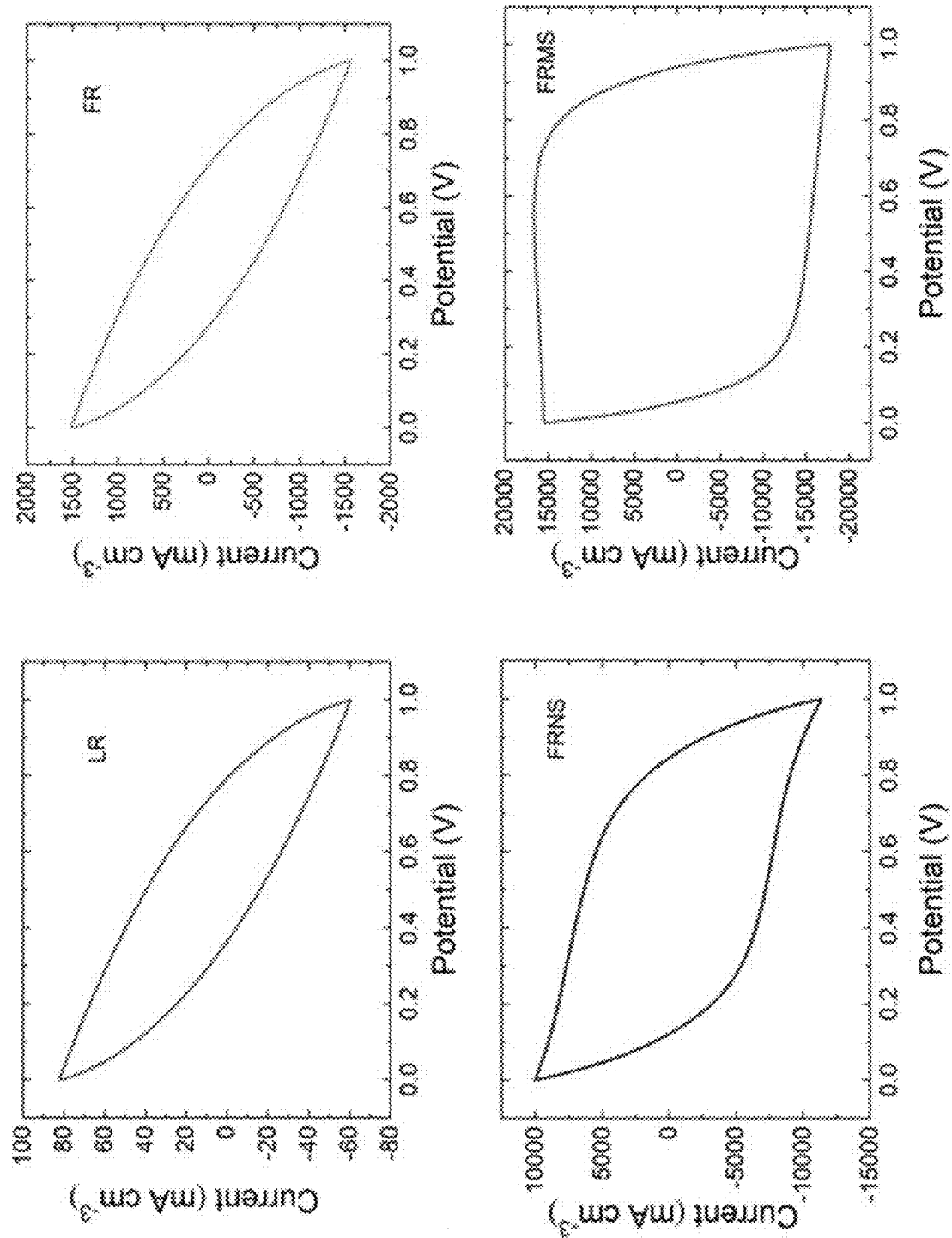
FIG. 17 depicts cyclic voltammograms of LR, FR, FRNS, and FRMS samples at a scan rate of 100 mV s-1. The integrated area of each cycle is correlated with the value of capacitance and increases from LR to the FRMS electrode by orders of magnitude. The FRMS CV curve reveals a rectangular shape that confirms the swift current response by voltage change.
Figure 18:
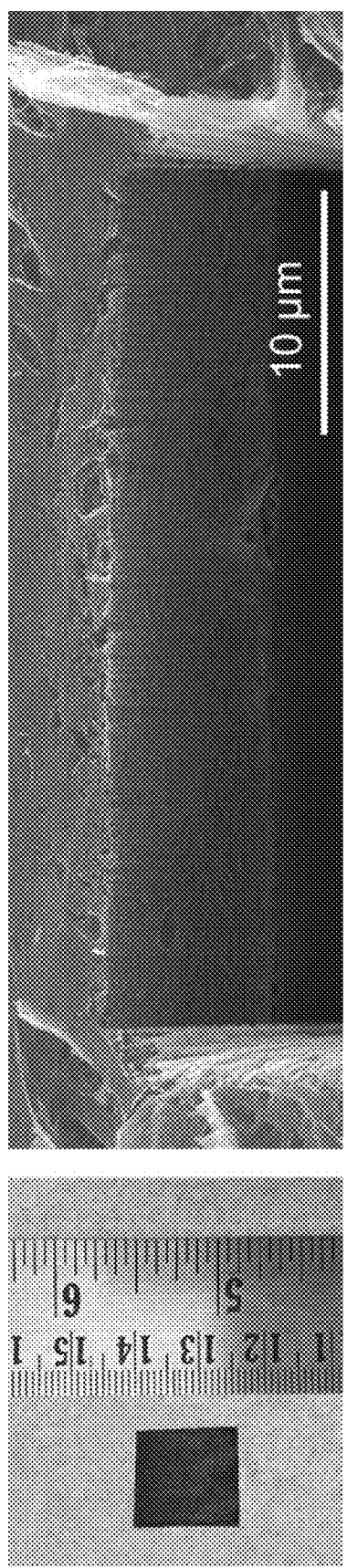
FIG. 18 depicts the measurement of effective area and thickness of electrodes by means of top view images and cross sectional SEM microscopy. The area was measured by AutoCAD software package. In order to estimate the thickness of rGO in samples, focused ion beam (FIB) was employed to create a pit in random locations and take cross sectional SEM images.
Figure 19:
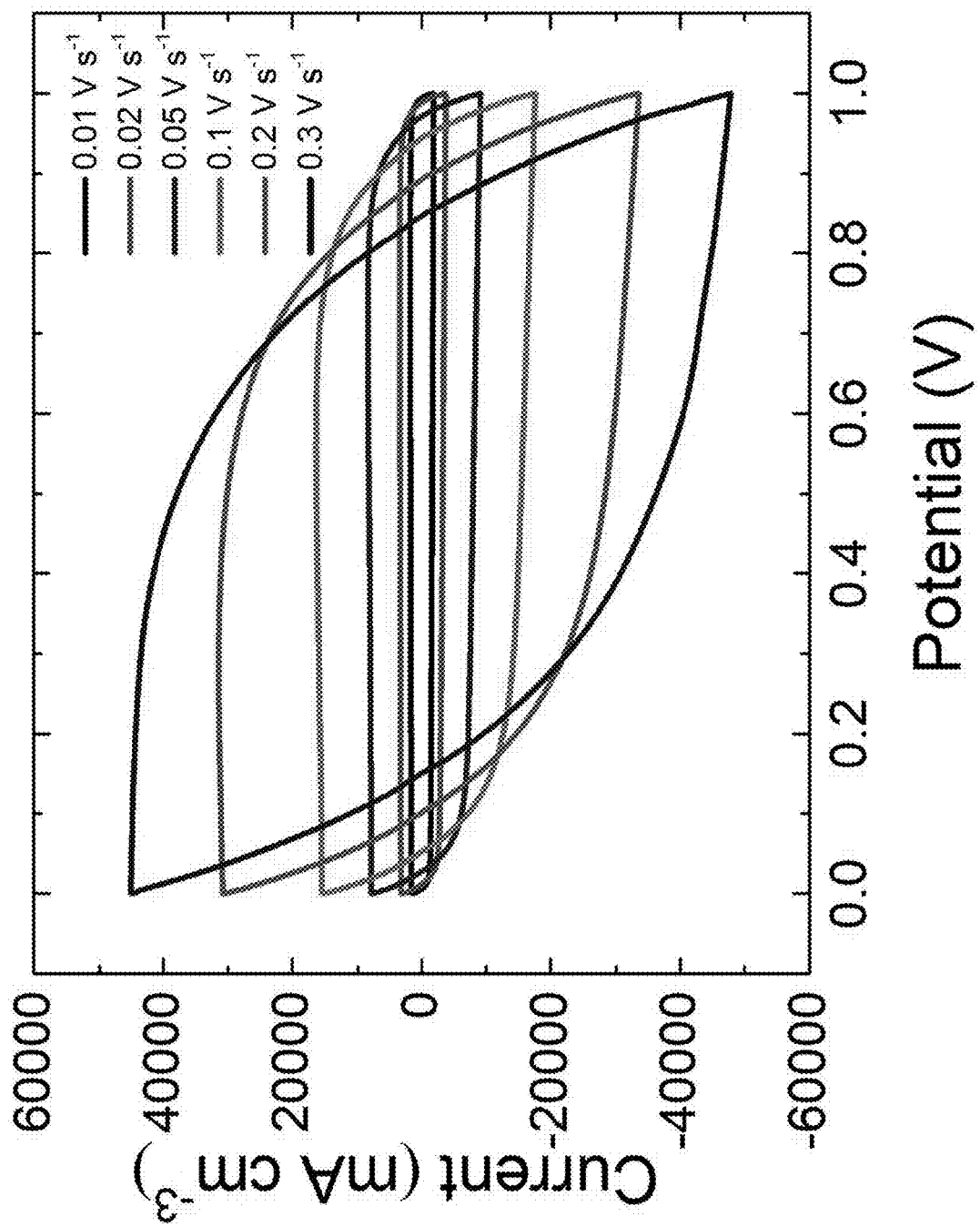
FIG. 19 is a plot of Cyclic voltammetry (CV) tests of FRMS device in several scan rates. The increase of specific current (current per unit volume) in this device with increase of scan rate from 0.01 V s$^{-1}$ to 0.3 V s$^{-1}$ indicates fast charge propagation within the electrode.

In order to understand the effect of morphological changes of graphene layers on the electrochemical behavior of electrodes, CV tests were performed on the samples. The CV curves (FIG. 17) were obtained using a scan rate of 100 mV s$^{-1}$ and were normalized by the volume of the film. FIG. 18 shows how volume was calculated: using area from top-view images and thickness by cross-sectional SEM microscopy. The rectangular symmetric shape of the CV curve for FRMS indicates the formation of an EDL capacitor. The increase of specific current (current per unit volume) for the FRMS device with an increase of scan rate from 10 to 300 mV·s$^{-1}$ (FIG. 19) indicates fast charge propagation within the electrode. Further, the LR sample showed a peak current density of 80 mA·cm$^{-3}$. The FRMS sample showed a current density of 15,000 mA cm$^{-2}$, which is 2 orders of magnitude higher than that of LR devices. The volumetric capacitance is estimated using two methods: (1) from the integration of CV curves and (2) from the GC/discharge curve. The volumetric capacitances of LR, FR, FRNS, and FRMS electrodes were calculated using the relation $$C_v = \frac{\int i \cdot dV}{v \cdot \Delta V \cdot \upsilon}$$

where C=volumetric capacitance (F cm$^{-3}$), I=voltammetric current (A), v=volume (cm$^3$) of the device, ΔV=sweep potential window (V), and v=scan rate (V·s$^{-1}$) (Yang and Bock, J. Power Sources 2017, 337, 73-81). The volumetric capacitances of LR, FR, FRNS, and FRMS electrodes were found to be 3.7, 178.7, 441.5, and 1205.2 F cm$^{-2}$, respectively. The GC/discharge curves were performed at a constant current density of 100 mA cm$^{-3}$ and shown in FIG. 20A. The triangular shape of the GC curve indicates fast ion transport and efficient EDL formation within the supercapacitor electrodes. The volumetric capacitance of the different supercapacitor designs was calculated from the GC/discharge values using the equation $$C_v = \frac{I}{v(-dV/dt)}.$$

Figure 21:
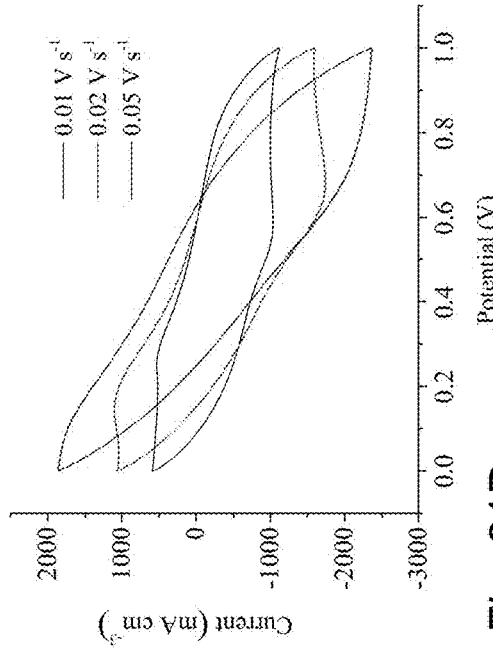
FIG. 21, comprising
Figure 21:
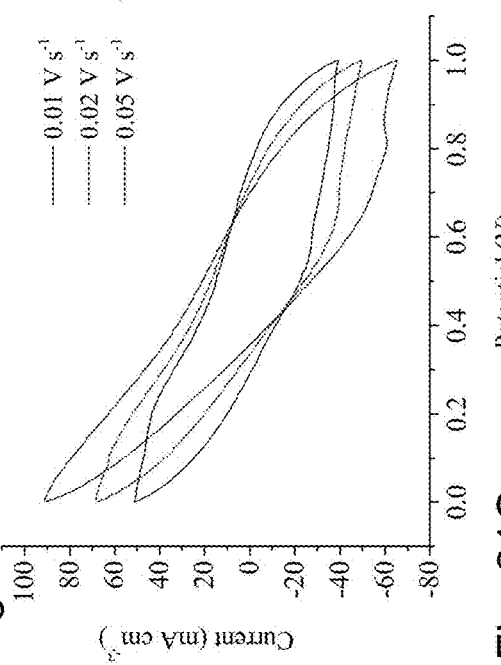
Figure 21:
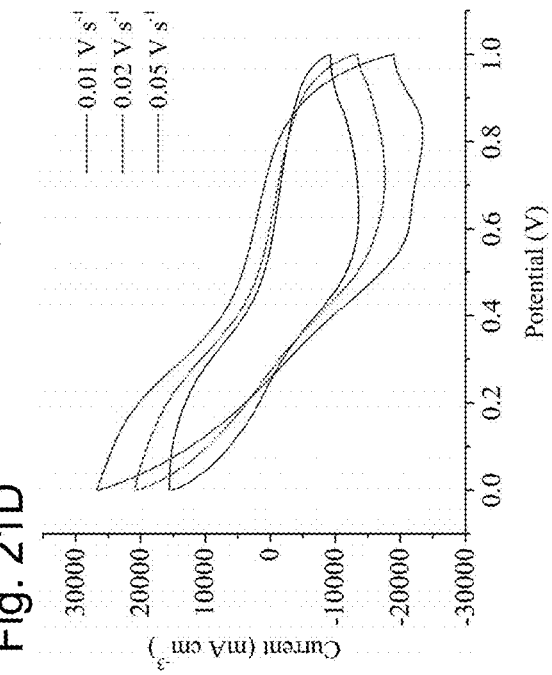
Figure 21:
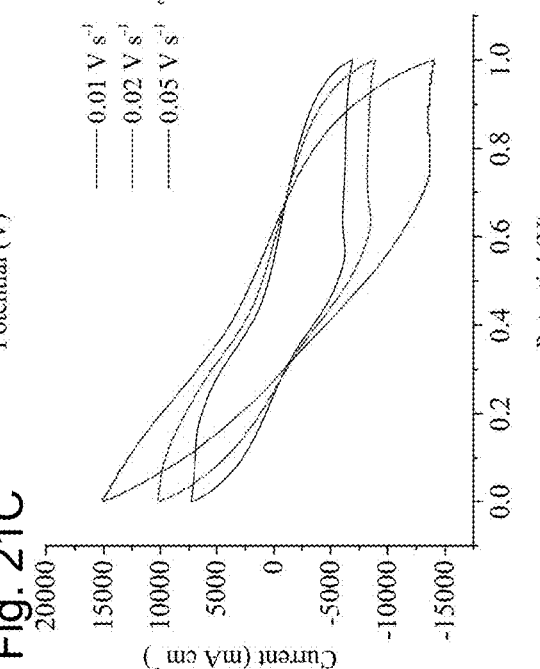

The volumetric capacitances obtained by charge/discharge curves were estimated to be 3.8 F cm$^{-3}$ (LR), 180.7 F cm$^{-3}$ (FR), 450.1 F cm$^{-3}$ (FRNS), and 1224.4 F cm$^{-3}$ (FRMS). The volumetric capacitance values estimated by the two methods are in agreement with each other. The IR drop (voltage drop at the start of each discharge curve) was measured to be ~0.01 V at 100 mA cm$^{-3}$, indicating very low resistance for all the devices. The corresponding results for the three-electrode test are shown in FIG. 21. Both the CV and charge/discharge diagrams show orders of magnitude differences in volumetric capacitance between the exemplary electrodes, possibly due to differences in residual GO and the interlayer spacing caused by the different methods of fabrication. These results show that significant improvements can be attained by manipulating and engineering the electrode materials. For example, 324 times greater volumetric capacitance can be obtained from flash reduction of GO on a fabricated substrate compared to laser scribing using the lightscribe method (FIG. 21a). Furthermore, reducing GO by the lightscribe method takes several hours to produce an acceptable amount of graphene, while much higher quality graphene structures can be produced in less than a second by this flash reduction technique. The average interlayer distance for each of the four electrodes are as the following: 1) 1.76 μm for FRMS; 2) 0.25 μm for FRNS; 3) 500 nm for FR; and 4)<100 nm for LR.

Figure 22:
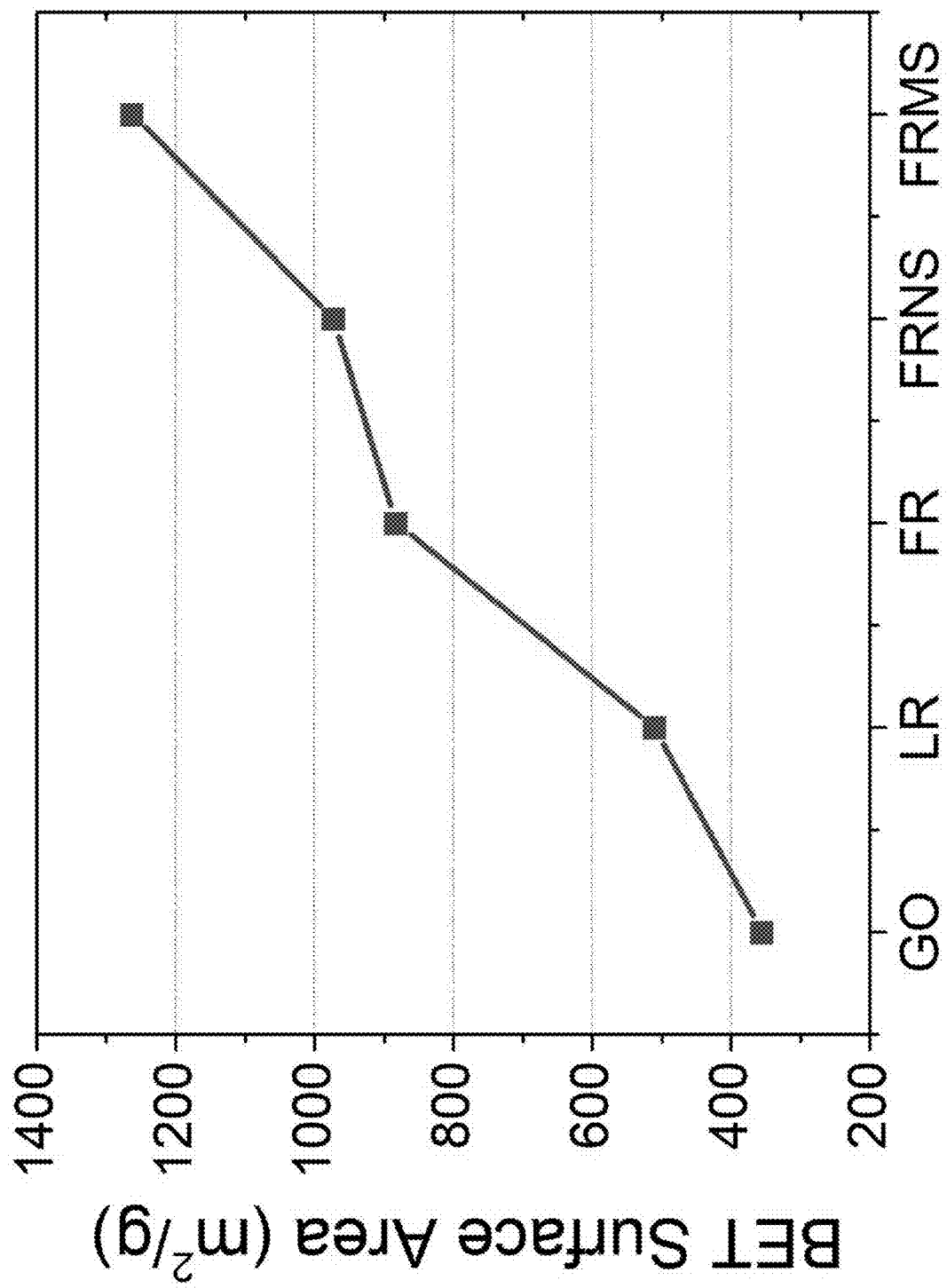
FIG. 22 is a plot of BET surface area measurements. The plot shows a dramatic increase in the BET surface area of the samples from 355.8 m$^2$ g$^{-1}$ (GO) to 1262.3 m$^2$ g$^{-1}$ (FRMS). This difference in BET surface area may explain the higher double layer capacitance of FRMS samples in comparison with other electrodes.
Figure 23:
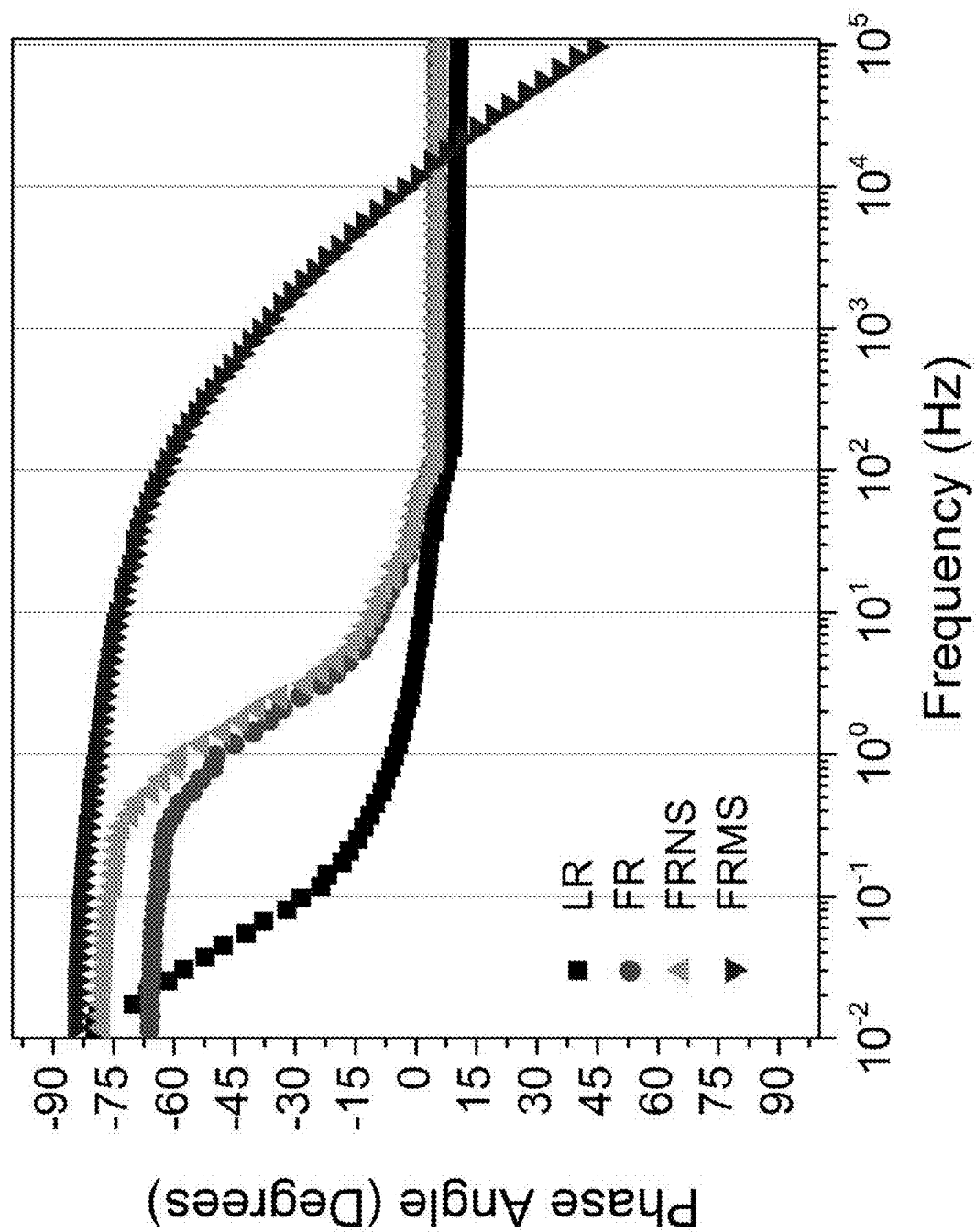
FIG. 23 is a plot of phase angle vs. frequency plot as determined by impedance spectroscopy. The measured time constant ($r_O$) is 20.9 s, 821.4 ms, 615.6 ms, and 1.75 ms for LR, FR, FRNS and FRMS samples, respectively. Accordingly, FRMS device has the lowest relaxation time among the tested devices.

Utilizing patterned substrates (FRNS and FRMS) instead of a flat surface (FR) also provided high specific capacitance. The specific capacitance was calculated using the equation:

$$C_s = \frac{I}{m(-dV/dt)}$$

where m is the active mass within the device. The active mass was calculated using two methods: (1) by weighing the sample after GO reduction and subtracting the weight of the substrate and (2) by using SEM to calculate the volume and estimating the mass using the density of graphene. The specific capacitance of FRMS was calculated to be 680.2 F g$^{-1}$ at a current density of 100 mA cm$^{-3}$, which is higher than the theoretical value of 552 F g$^{-1}$ reported for single-layer graphene. The theoretical value was calculated from the single-layer graphene intrinsic capacitance value of ~21 μF cm$^{-2}$ (Xia, et al., Nat. Nanotechnol. 2009, 4, 505-509) and the specific surface area of graphene ~2630 m$^2$ g$^{-1}$ (Zhu, et al., Science 2011, 332, 1537-1541; Chen and Dai, Mater. Today 2013, 16, 272-280; Liu, et al., Nano Lett. 2010, 10, 4863-4868; Stoller, et al., Nano Lett. 2008, 8, 3498-3502; Taberna, et al., J. Electrochem. Soc. 2003, 150, A292-A300). Because of the use of reduced GO and existence of residual oxygen in the samples, pseudocapacitance and double-layer capacitance both contribute to the total capacitance value (Chee, et al., J. Phys. Chem. C 2016, 120, 4153-4172; Shao, et al., Chem. Soc. Rev. 2015, 44, 3639-3665). As a result, the measured capacitance for the FRMS sample is higher than the theoretical value. Thus, this interconnected graphene network produced using the inexpensive precursor GO provides higher specific capacitance than single layer graphene, which has been predicted to exhibit the highest electrochemical capacitance among different types of graphene. The micro structure patterned electrode (FRMS) demonstrated 172% higher capacitance compared to the nano structured graphene electrode (FRNS), which may be due to the ~51% greater interlayer spacing of graphene sheets and the ~14.5× greater conversion of GO to graphene on FRMS samples compared to FRNS samples. BET results showed that the FRMS sample has a specific surface area (i.e., ion-accessible area) of 1262.3 $m^2 \cdot g^{-1}$, which is about 4-fold higher than that obtained for GO samples (355.8 $m^2 \cdot g^{-1}$, Figure found for GO samples (FIG. 22). Further confirmation of fast ion transport in the FRMS device is supported by the EIS results shown in FIG. 20B. At low frequency, the curve for FRMS showed a large slope with sharp (90°) rise, indicating high accessible surface area in the graphene film. At higher frequency, the intercept of the Nyquist plot can be utilized to measure the internal and charge-transfer resistance. The FRMS device showed the least internal resistance among the different tested designs and found to be 5.8 $\Omega cm^{-2}$ compared to 10340 $\Omega cm^{-2}$ measured for LR. In addition, the FRMS showed quite small charge transport resistance with an almost invisible semicircle, demonstrating the superiority of the device by retaining the capacitive behavior even at higher frequencies. Further, the angle of the lower-frequency region with respect to the horizontal axis signifies the capacitive behavior of the electrode (the higher the angle, the more the capacitive behavior). The near vertical shape of the EIS curve for the FRMS device indicates a superior capacitive behavior compared to other electrode designs. Finally, the time constant, $\tau_0$, (which is the time needed to discharge all energy with >50% efficiency) (Pech, et al., Nat. Nanotechnol. 2010, 5, 651-654; Beidaghi and Wang, Adv. Funct. Mater. 2012, 22, 4501-4510) is calculated from the impedance phase angle versus frequency curve to be 20.9 s (LR), 821.4 ms (FR), 615.6 ms (FRNS), and 1.75 ms (FRMS) (FIG. 23). This result suggests that the FRMS device is also suitable for deriving instantaneous power and that the relaxation time is lower than other reported values such as activated carbon (700 ms; Beidaghi and Wang, Adv. Funct. Mater. 2012, 22, 4501-4510), onion-like carbon (26 ms; Kyeremateng, et al., *Nat. Nanotechnol.* 2017, 12, 7-15), and interdigital graphene/CNT electrodes (4.8 ms; Nagasubramanian, et al., *J. Power Sources* 1999, 83, 193-203).

Figure 20:
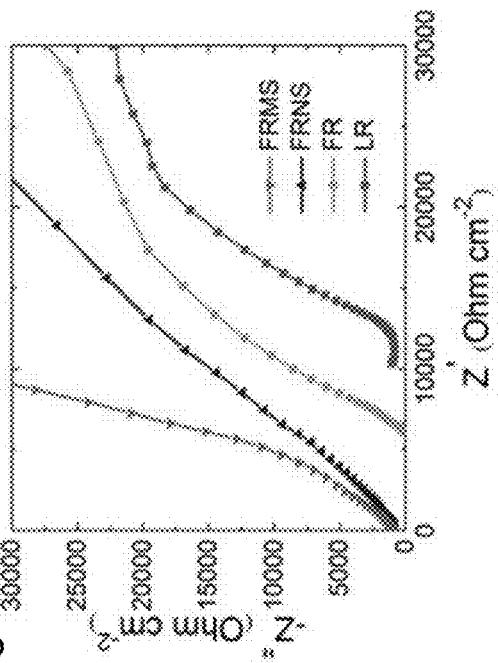
FIG. 20, comprising
Figure 20:
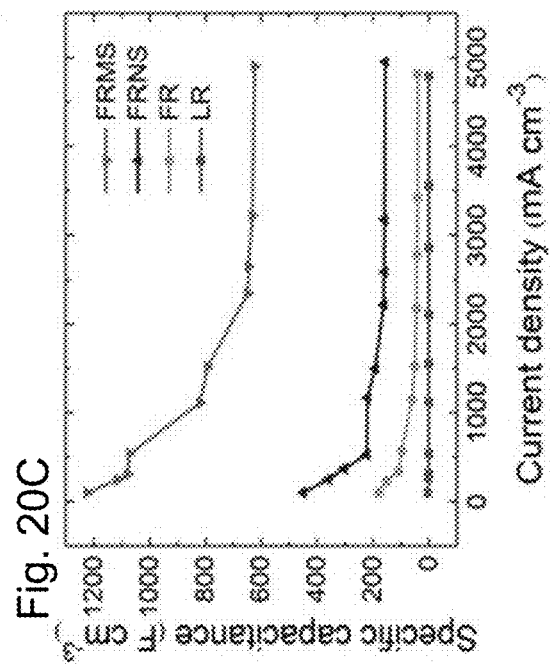
Figure 20:
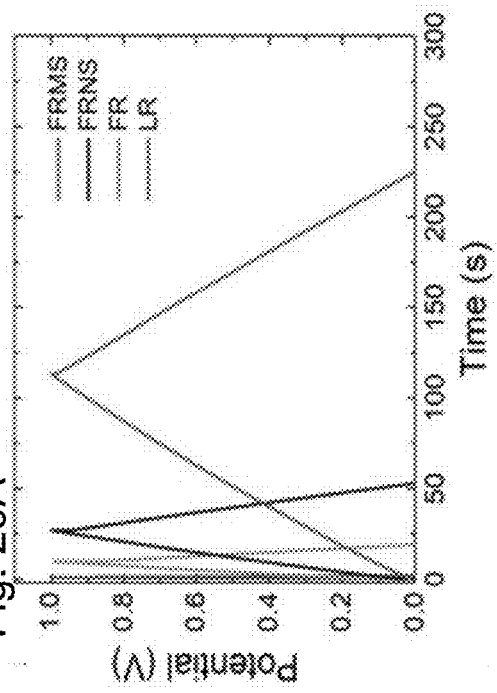
Figure 24:
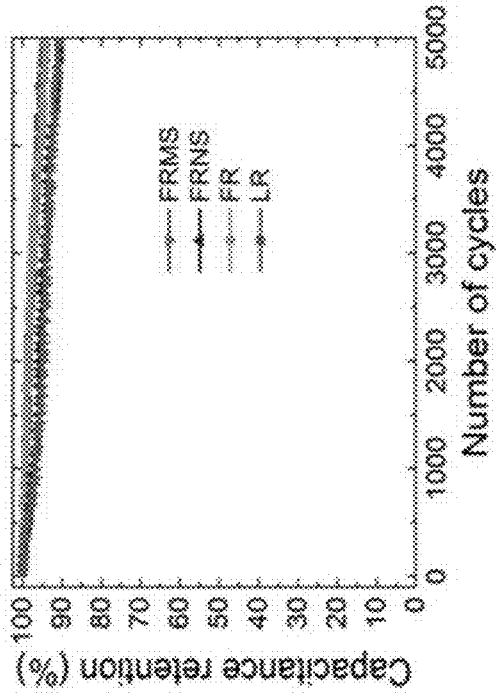
FIG. 24, comprising
Figure 24:
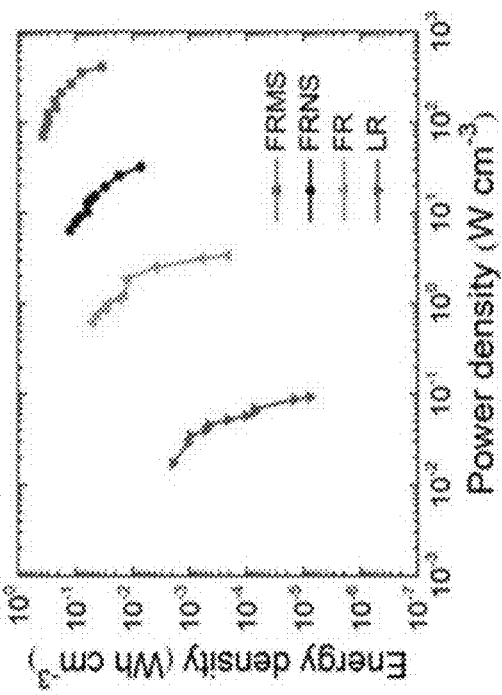

The volumetric capacitance of all the devices was measured as a function of current density (FIG. 20C). The specific capacitance decreases with the current density. The FRMS device retains more than 50% of its capacitance when operated at an ultrahigh current density of 4900 mA $cm^{-3}$. The highest volumetric capacitance of the FRMS electrode was 1224.4 F $cm^{-3}$, obtained at a current density of 100 mA $cm^{-3}$; the volumetric capacitance was decreased to a value of 648.3 F $cm^{-3}$ when the current density was increased to 2346 mA $cm^{-3}$. The lowest volumetric capacitance for the FRMS sample was still much higher than the highest value obtained from other samples (FIG. 21C). The retention of capacitance as a function of scan rate is shown in FIG. 24A. The volumetric capacitance for the LR sample dropped dramatically to 25% of its initial capacitance value by increasing the scan rate from 10 to 50 mV $s^{-1}$ (slope≈−17.1%/mV $s^{-1}$). However, the volumetric capacitance for FR samples (FR, FRNS, and FRMS) decreased with a milder slope (≈−4.4%/mV $s^{-1}$). Interestingly, the specific capacitance of the FRMS sample retained more than 80% of its initial capacitance value at a higher scan rate of 50 mV $s^{-1}$. The higher diffusion rate of ions in the FRMS sample, which is caused due to the high electrolyte wettability of electrodes, is most likely responsible for maintaining the high volumetric capacitance at high scan rates. The capacitance retention of electrodes after being subjected to 5000 charge/discharge cycles is shown in FIG. 24B. The FRMS electrode was able to retain 91% of its initial capacitance after 5000 cycles. However, it is observed that the FR samples (FR, FRNS, and FRMS) lose their initial capacitance slightly faster than the LR electrode. This loss of capacitance may be due to a decrease in graphene interlayer spacing over 5000 cycles, which may reduce the accessible surface area and may affect the capacitance retention of the active material. However, this effect could be mitigated in on-chip and practical energy storage applications by utilizing appropriate designs and through the use of solid electrolytes.

Figure 25:
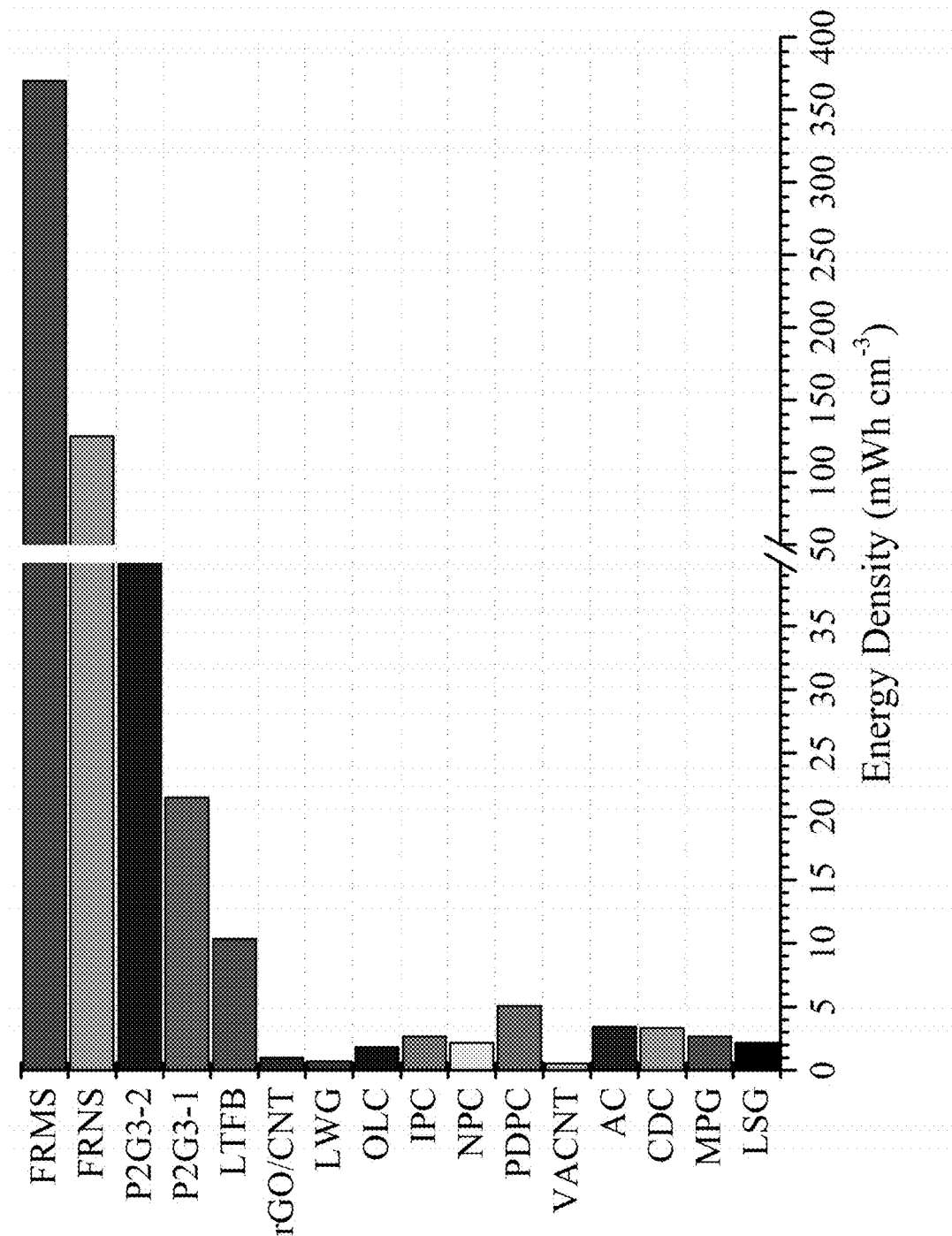
FIG. 25 is a comparison of the energy density obtained from exemplary FRMS and FRNS electrodes with recently published novel electrodes. FRMS electrode shows the highest value of energy density (370 mWh cm-3), among the carbon based electrodes. So far, the energy density obtained from carbon based electrodes are limited to ~50 mWh cm-3. LSG: Laser Scribed Graphene; MPG: Methane Plasma Reduced Graphene; CDC: Carbide Derived Carbon; AC: Activated Carbon; VACNT: Vertically Aligned Carbon Nanotube; PDPC: Polystyrene-derived Porous Carbon; NPC: Nitrogen-doped Porous Carbon; IPC: Inkjet-printed Carbon; OLC: Onion-like Carbon; LWG: Laser Written Graphene Oxide; rGO: Reduced Graphene Oxide; CNT: Carbon Nanotube; LTFB: Lithium Thin-film Battery; P2G3: Polyaniline/Graphene; FRNS: Flash Reduced Nanostructure; FRMS: Flash Reduced Microstructure.
Figure 26:
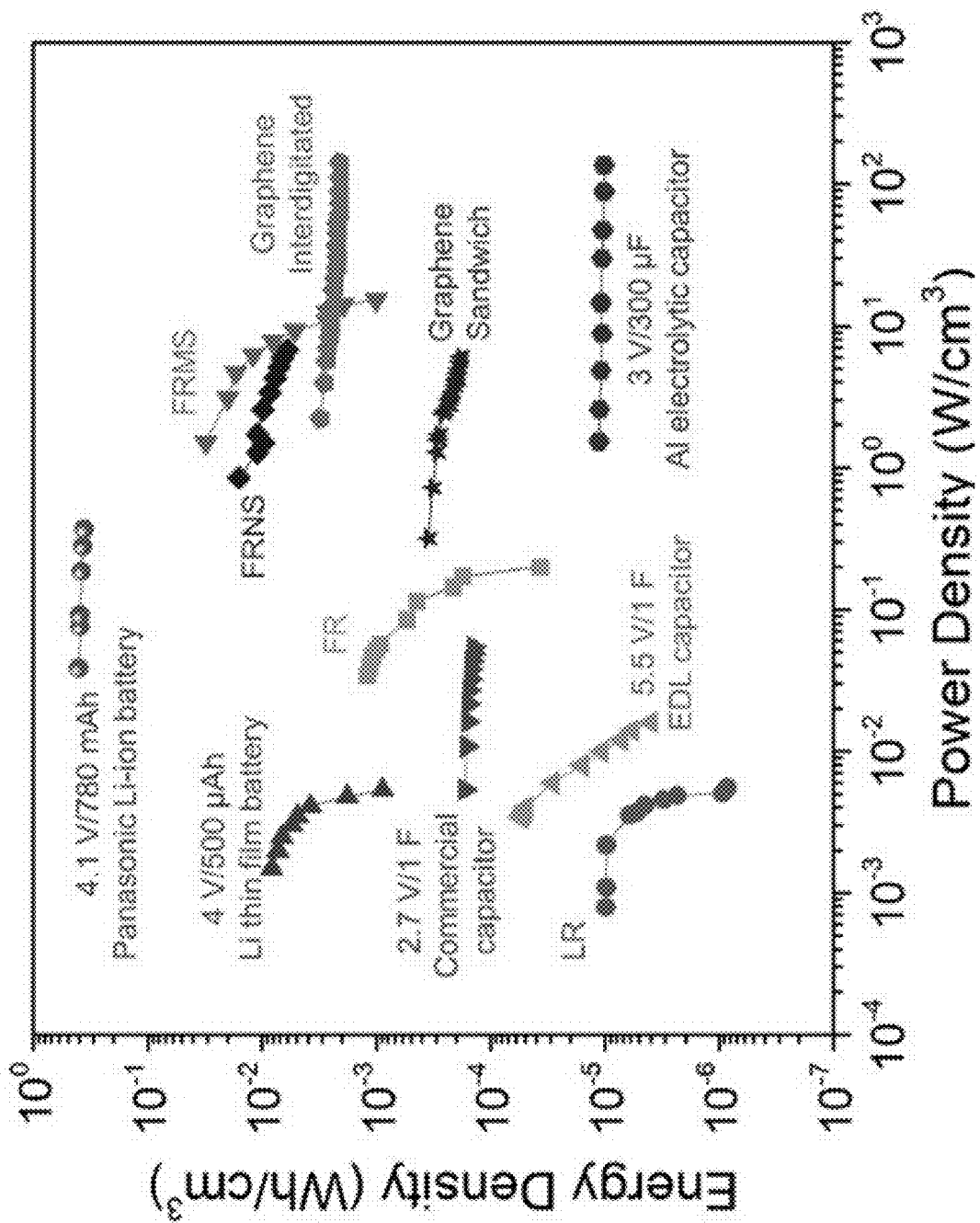
FIG. 26 is a comparison of the FRMS electrode properties with several commercial and conventional energy storage devices. The FRMS electrode exhibits ultrahigh energy and power densities compared to Li thin-film batteries, graphene interdigitated thin-film supercapacitor, and several other high-end energy storage devices.

In order to further evaluate the electrochemical performance of the supercapacitor devices and bulk electrodes, the energy density (E) and power density (P) were calculated from the charge discharge curve using the relationship: $E=\frac{1}{2}CV^2$, $C=I/(-dV/dt)$, $P=E/t$, where t=time. FIG. 24C shows the Ragone plot for different types of interconnected graphene structures used in this study considering the volume of the active materials at the electrode (calculated from the three-electrode tests). Increasing the spacing between graphene layers and increasing the level of conversion of GO to graphene improves both the energy density and the power density of the electrodes. The power density and energy density achieved by FRMS electrodes are roughly 3 orders of magnitude higher than that of LR electrodes. Through the use of flash reduction instead of laser reduction, the energy density was increased from 2 mW·h·$cm^{-3}$ (LR) to 370 mW·h·$cm^{-3}$ (FRMS). Similarly, the power density was increased by 5 orders of magnitude for the FRMS device compared to the LR device (0.09 W·$cm^{-3}$ for LR compared to 416.6 W·$cm^{-3}$ for FRMS. In fact, as shown in FIG. 25, most reported carbon-based supercapacitors show energy densities <50 mW·h·$cm^{-3}$. FIG. 26 shows a Ragone plot comparing the different thin-film-based energy storage devices. The data include results from our own devices, commercial supercapacitors tested under the same dynamic conditions: Maxwell Technologies ultracapacitors. 2.7 V/1 F) and Cornell Dubilier EDL supercapacitor (5.5 V/1 F), various literature data for batteries: Li thin-film battery (4 V/500 µA h; Beidaghi and Wang, Adv. Funct. Mater. 2012, 22, 4501-4510) and Panasonic Li-ion battery (4.1 V/780 mA h) as well as supercapacitors: electrolytic (3 V/300 µF; El-Kady, et al., Science 2012, 335, 1326-1330), graphene-based-sandwiched capacitor (Wu, et al., Adv. Mater. 2015, 27, 4054-4061), and graphene-based interdigitated capacitors. The FRMS thin-film sandwich-type device showed energy densities of up to 31 mW·h·$cm^{-3}$, which is 4 times higher than the Li thin-film battery (8 mW·h·$cm^{-3}$) and 4 orders of magnitude higher than the aluminum electrolytic capacitors (0.0114 mW·h·$cm^{-3}$). Further, the energy density of the FRMS device is approximately 88 times higher than the state-of-the-art graphene-based-sandwiched supercapacitors (Wu, et al., Adv. Mater. 2015, 27, 4054-4061). However, these energy densities are still an order of magnitude less than the value obtained by the bulk electrodes (Panasonic Li battery, 403 mW·h·$cm^{-3}$). In addition, the power density of the FRMS device (15.3 W·$cm^{-3}$) is 41 times higher than the bulk Li-ion battery (0.37 W·$cm^{-3}$), 3 orders of magnitude higher than the Li thin-film battery (0.005 W $cm^{-3}$), and 2 times higher than the state-of-the-art graphene-based-sandwiched supercapacitors (6.1 W $cm^{-3}$).

Figure 27:
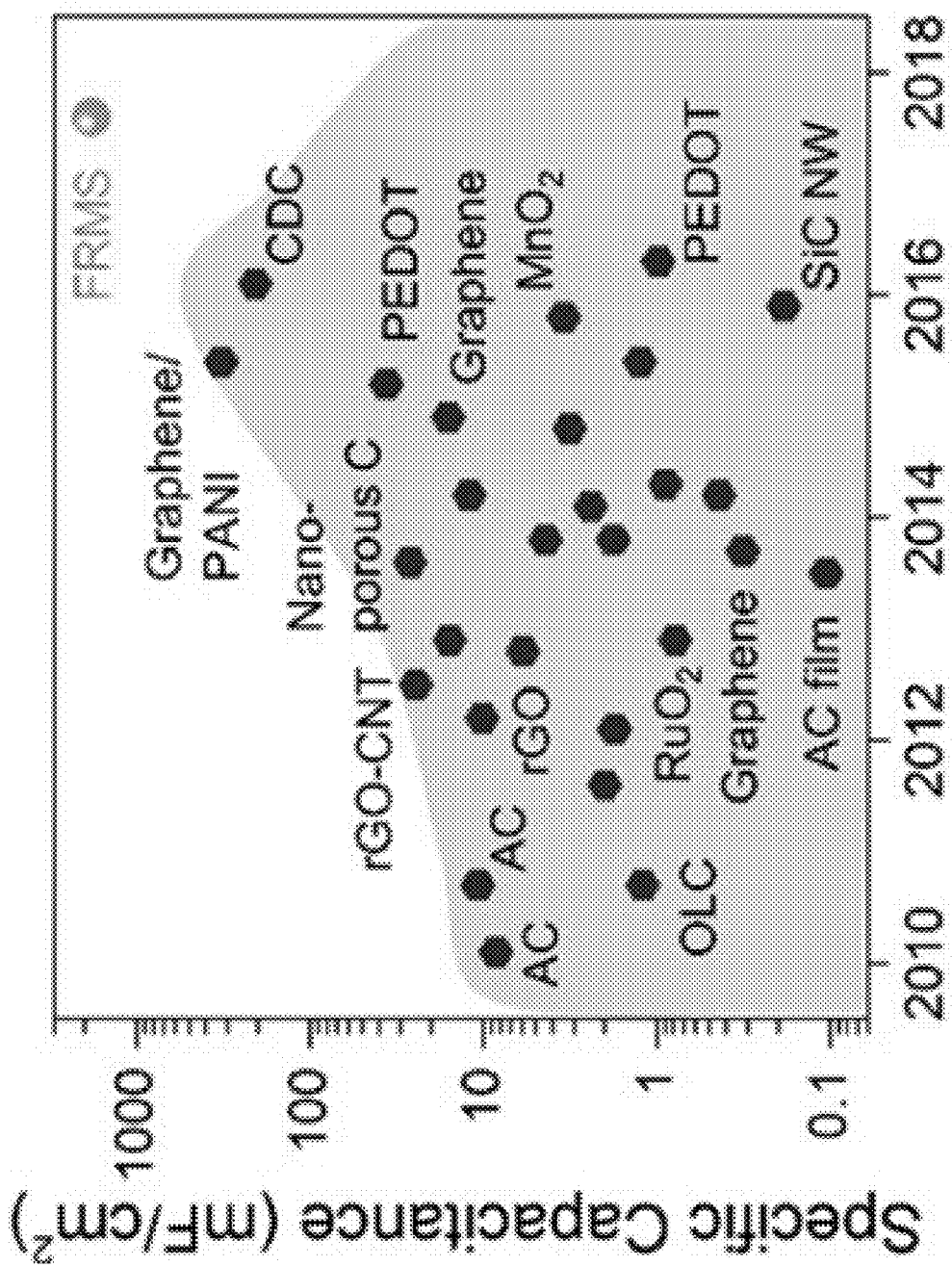
FIG. 27 is a comparison of areal capacitance for FRMS and recent supercapacitor electrodes. FRMS electrode shows an ultra-high specific areal capacitance that makes it suitable for flexible and wearable electronics. The value of areal capacitance for an exemplary FRMS electrode is approximately 5.6 times larger than Graphene/PANI electrodes. It is the highest value achieved so far for any type of pure carbon based electrode. C: Carbon; AC: Activated Carbon; OLC: Onion-like Carbon; rGO: Reduced Graphene Oxide; CNT: Carbon Nanotube; CDC: Carbide Derived Carbon; PEDOT: Polyethylenedioxythiophene, NW: Nanowire; PRDC: Photoresist Derived Carbon; FRMS: Flash Reduced Microstructure; PANI: Polyaniline.

Although the power density of the FRMS sandwich-type device is lower than the power density of interdigitated devices (141.8 W cm$^{-3}$), the device was discharged at much shorter time (1.75 ms) compared to the interdigitated supercapacitor (19 ms). Further, the high power densities are generally observed at lower energy densities. For example, the power density of 137 W cm$^{-3}$ for the aluminum electrolytic capacitor was observed at 0.01 mW h cm$^{-2}$, and for the in-plane graphene micro-supercapacitor (Wu, et al., Nat. Commun. 2013, 4, 2487), a power density of 495 W cm$^{-3}$ was observed at an energy density of 0.14 mW h cm$^{-3}$. However, the power density of 15.3 W cm$^{-2}$ was observed in the FRMS devices even at a higher energy density of 1 mW h cm$^{-3}$. Finally, the inventive devices outperformed most of the existing bulky as well as thin-film-based micro-supercapacitor designs reported over the past years (FIG. 27). The combination of results discussed herein open up new horizons for practical applications of graphene based structures in countless energy applications and introduce serious competition for Li-ion batteries.

A novel method for taking advantage of the full potential of graphene-based structures through substrate engineered interconnected layers in energy applications has been successfully accomplished. Improved performance in the volumetric capacitance, energy density, and power density of graphene-based electrodes has been achieved by adjusting the graphene interlayer spacing and improved diffusion of ions. Furthermore, it is presented that the GO conversion value to graphene is an important consideration while using it as a precursor because of its influence on the electrochemical characterization of electrodes. By controlling the value of GO conversion and interlayer spacing of a graphene network, a high specific capacitance of 680.2 F·g$^{-1}$ was obtained. Likewise, on these electrodes, an extremely high energy density of 370 mW·h·cm$^{-3}$ was obtained along with a high power density of 416.6 W·cm$^{-3}$. Above all, these modifications are applied by means of a flash reduction process of GO and patterning of the transparent PET substrate. Thus, the whole process is cost-efficient, faster, and amenable to scale-up for practical electrochemical energy storage applications.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A method of fabricating graphene, the method comprising:
   providing a patterned substrate, said patterned substrate comprising protrusions or indentations;
   depositing graphene oxide on the patterned substrate; and
   reducing the graphene oxide to graphene;
   wherein the patterned substrate has structures between 50 nm and 500 nm in height.

2. The method of claim 1, wherein the patterned substrate comprises polyethylene terephthalate (PET).

3. The method of claim 1, further comprising the step of ultrasonicating the graphene oxide prior to deposition.

4. The method of claim 1, wherein the step of depositing graphene oxide comprises a technique selected from the group containing spin coating, drop casting, pad printing, doctor blading, casting, screen printing, ink-jet printing, roll coating, and brush coating.

5. The method of claim 1, wherein the step of reducing the graphene oxide to graphene comprises treating the graphene oxide with a high intensity light.

6. The method of claim 5, wherein the high intensity light is generated with a xenon flash.

7. A graphene structure produced using the method of claim 1.

8. The graphene structure of claim 7;
   wherein the graphene structure comprises multiple layers; and
   the average distance between layers is greater than 1.6 μm.

9. The graphene structure of claim 7;
   wherein the graphene structure comprises carbon and oxygen; and
   the oxygen content of the graphene structure is less than 25 at. %.

10. An electrode comprising the graphene structure of claim 7.

11. A capacitor comprising at least one electrode of claim 10.

12. A method of fabricating graphene, the method comprising:
   providing a patterned substrate, said patterned substrate comprising protrusions or indentations;
   depositing graphene oxide on the patterned substrate; and
   reducing the graphene oxide to graphene;
   wherein the patterned substrate has structures between 1.0 μm and 3 μm in height.

13. The method of claim 12, wherein the patterned substrate comprises polyethylene terephthalate (PET).

14. The method of claim 12, further comprising the step of ultrasonicating the graphene oxide prior to deposition.

15. The method of claim 12, wherein the step of depositing graphene oxide comprises a technique selected from the group containing spin coating, drop casting, pad printing, doctor blading, casting, screen printing, ink-jet printing, roll coating, and brush coating.

16. The method of claim 12, wherein the step of reducing the graphene oxide to graphene comprises treating the graphene oxide with a high intensity light.

17. The method of claim 16, wherein the high intensity light is generated with a xenon flash.

18. A graphene structure produced using the method of claim 12.

19. The graphene structure of claim 18;
   wherein the graphene structure comprises multiple layers; and
   the average distance between layers is greater than 1.6 μm.

20. The graphene structure of claim 18;
   wherein the graphene structure comprises carbon and oxygen; and
   the oxygen content of the graphene structure is less than 25 at. %.

21. An electrode comprising the graphene structure of claim 18.

22. A capacitor comprising at least one electrode of claim 21.

* * * * *